(12) United States Patent
Toyonaga et al.

(10) Patent No.: US 9,530,782 B2
(45) Date of Patent: Dec. 27, 2016

(54) NONVOLATILE SEMICONDUCTOR MEMORY DEVICE COMPRISING MEMORY GATE AND PERIPHERAL GATE HAVING DIFFERENT THICKNESSES

(71) Applicant: KABUSHIKI KAISHA TOSHIBA, Tokyo (JP)

(72) Inventors: Kazunari Toyonaga, Yokkaichi Mie (JP); Shoichi Watanabe, Yokkaichi Mie (JP); Karin Takayama, Yokkaichi Mie (JP); Shotaro Murata, Kariya Aichi (JP); Satoshi Nagashima, Yokkaichi Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/617,694

(22) Filed: Feb. 9, 2015

(65) Prior Publication Data
US 2015/0263014 A1 Sep. 17, 2015

Related U.S. Application Data

(60) Provisional application No. 61/951,941, filed on Mar. 12, 2014.

(51) Int. Cl.
*H01L 29/788* (2006.01)
*H01L 27/115* (2006.01)

(52) U.S. Cl.
CPC ... *H01L 27/11543* (2013.01); *H01L 27/11524* (2013.01)

(58) Field of Classification Search
CPC .................... H01L 27/11524; H01L 27/11543

USPC ......................................................... 257/316
See application file for complete search history.

(56) References Cited

U.S. PATENT DOCUMENTS

| 6,774,442 | B2 | 8/2004 | Hayashi et al. |
| 7,067,871 | B2 | 6/2006 | Ozawa |
| 7,936,005 | B2 | 5/2011 | Okamura |
| 8,592,272 | B2 | 11/2013 | Matsuno |

(Continued)

FOREIGN PATENT DOCUMENTS

| JP | S54-156483 | 12/1979 |
| JP | 2007-049143 | 2/2007 |

(Continued)

OTHER PUBLICATIONS

Taiwanese Office Action dated May 5, 2016, filed in Taiwan counterpart Patent Application No. 103129228, 9 pages (with English translation).

*Primary Examiner* — Matthew Gordon
(74) *Attorney, Agent, or Firm* — Patterson & Sheridan, LLP

(57) ABSTRACT

A nonvolatile semiconductor memory device includes a semiconductor substrate, a memory element including a first gate electrode having a first thickness disposed on a first insulation film on the semiconductor substrate, and a first peripheral element other than a memory element including a second gate electrode having a second thickness disposed on a second insulation film on the semiconductor substrate. The first gate electrode and second gate electrode comprise a plurality of film layers, and the configuration of the film layers are different as between the first gate electrode of the memory element and the second gate electrode of the peripheral element, and the first thickness is different from the second thickness.

3 Claims, 32 Drawing Sheets

(56) References Cited

U.S. PATENT DOCUMENTS

| | | | |
|---|---|---|---|
| 2003/0127681 A1* | 7/2003 | Nishioka | H01L 27/105 257/315 |
| 2005/0224863 A1 | 10/2005 | Hieda et al. | |
| 2008/0017904 A1* | 1/2008 | Akiyama | G11C 7/18 257/300 |
| 2009/0315099 A1* | 12/2009 | Park | H01L 27/11526 257/324 |
| 2012/0146125 A1* | 6/2012 | Kim | H01L 27/11524 257/321 |
| 2013/0193504 A1 | 8/2013 | Kinoshita et al. | |
| 2013/0240973 A1 | 9/2013 | Matsuno | |

FOREIGN PATENT DOCUMENTS

| | | |
|---|---|---|
| JP | 2007-221143 | 8/2007 |
| JP | 2007-258401 | 10/2007 |
| JP | 4651848 | 3/2011 |
| JP | 2013069794 | 4/2013 |

* cited by examiner

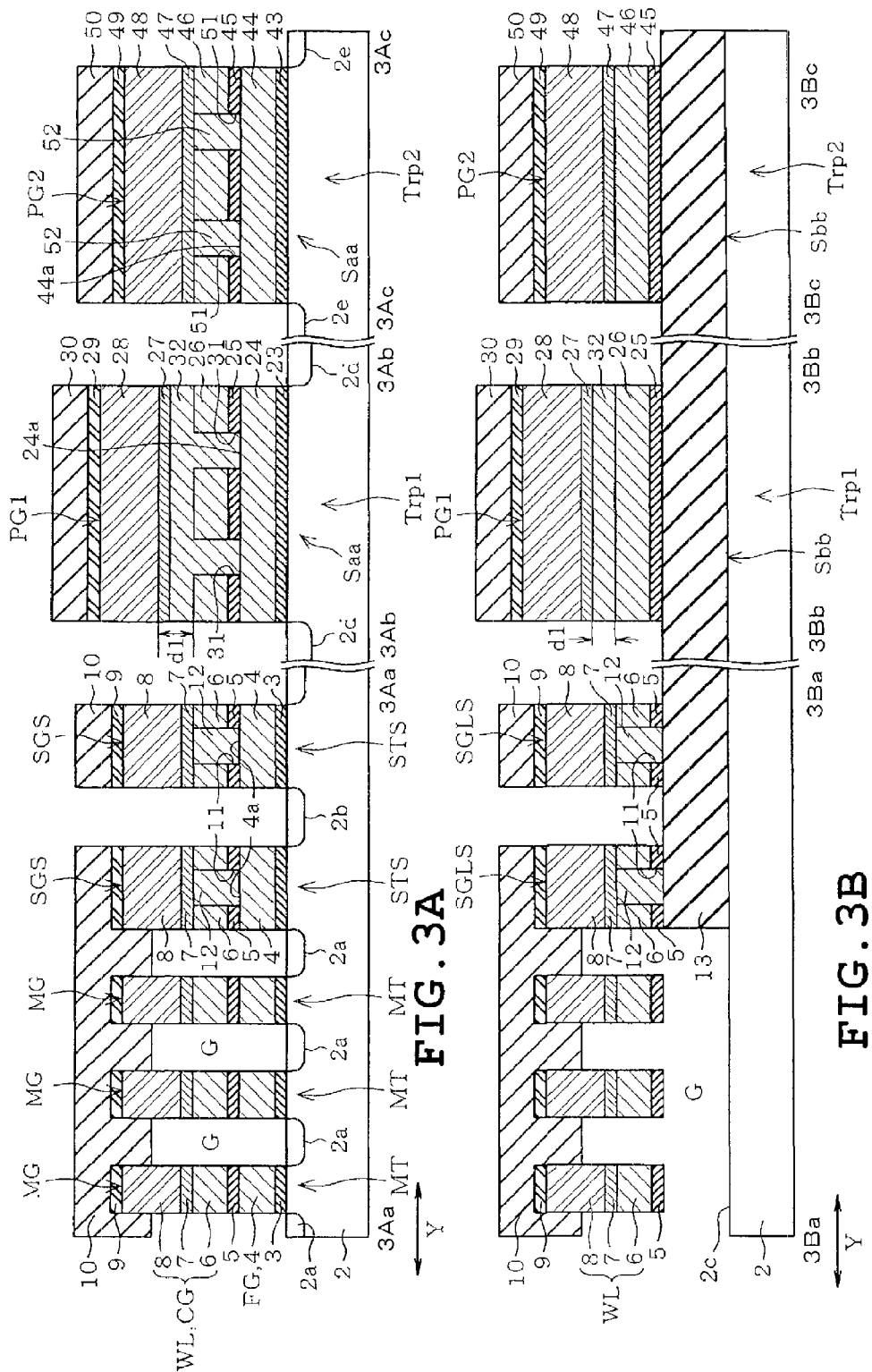

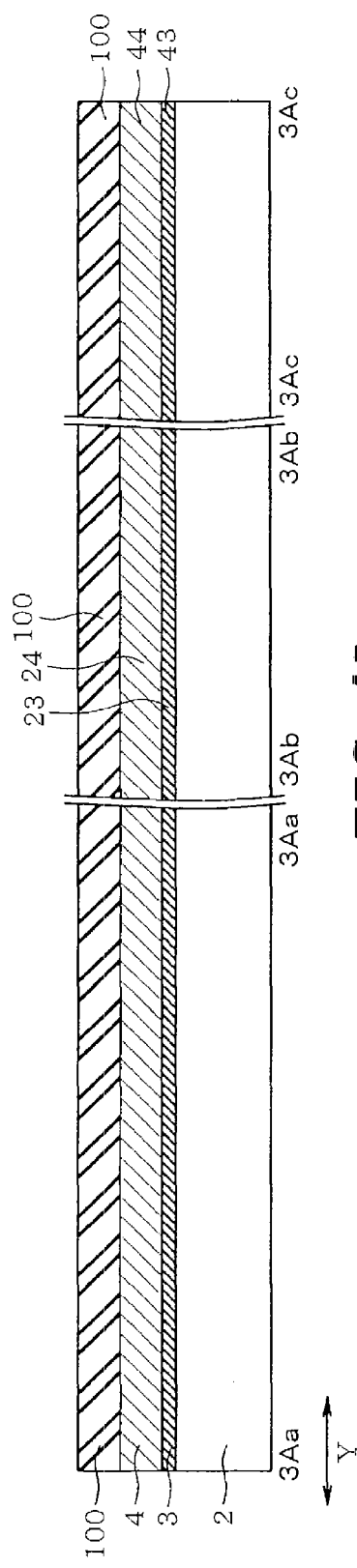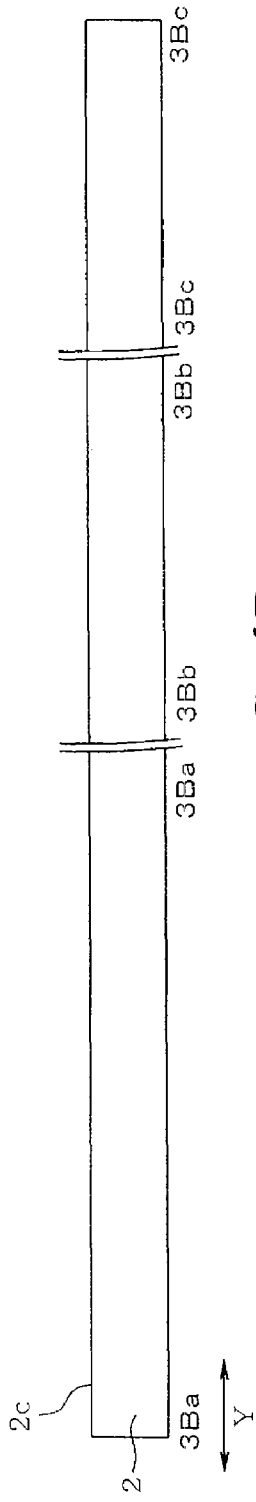
FIG. 4A
FIG. 4B

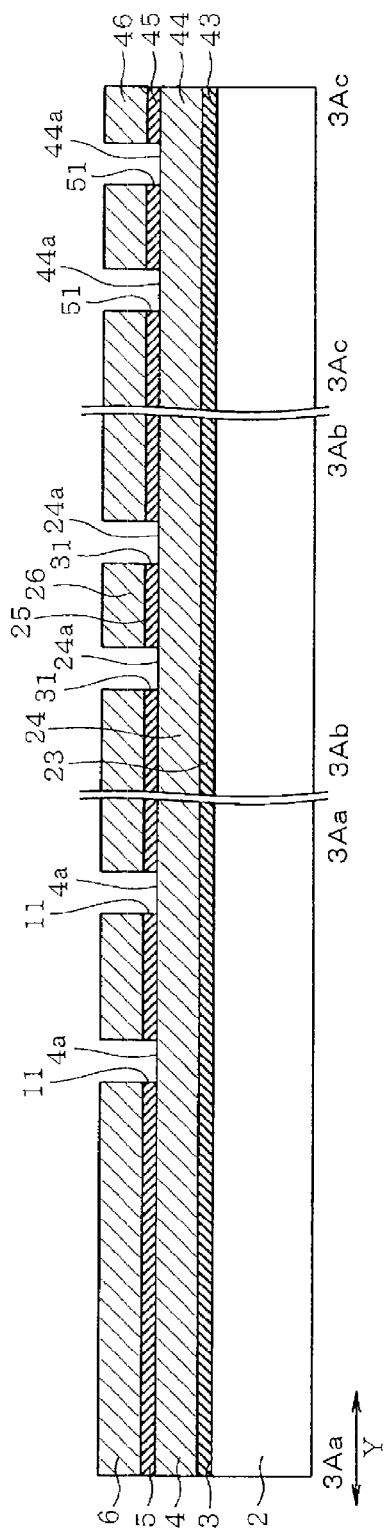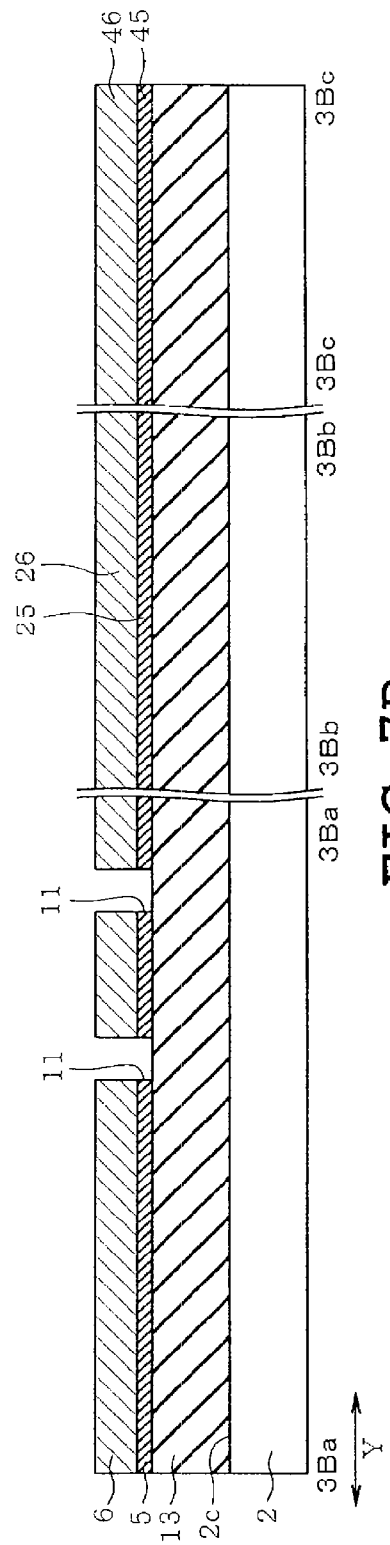

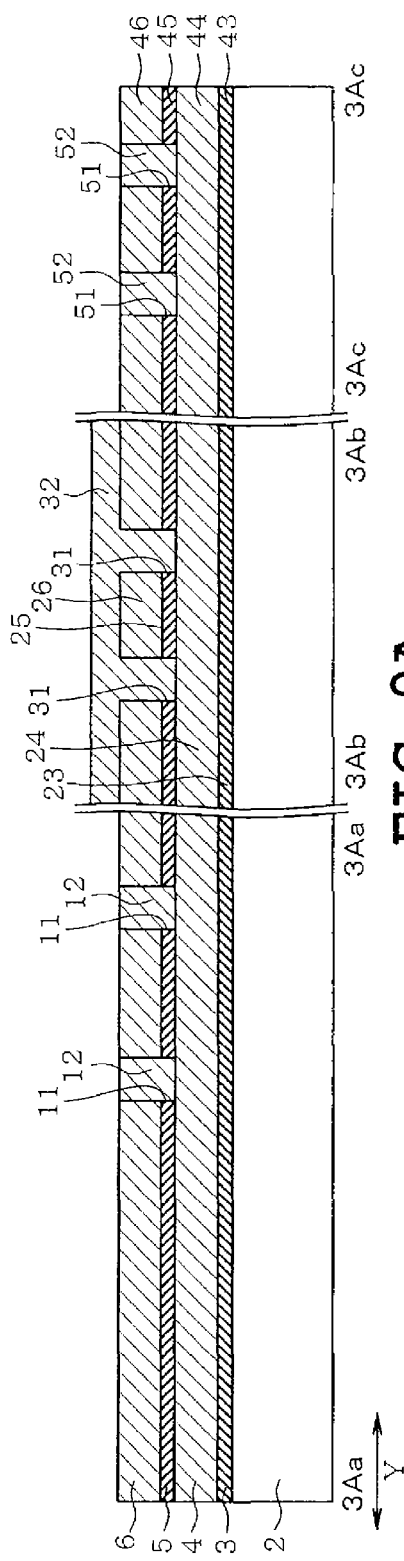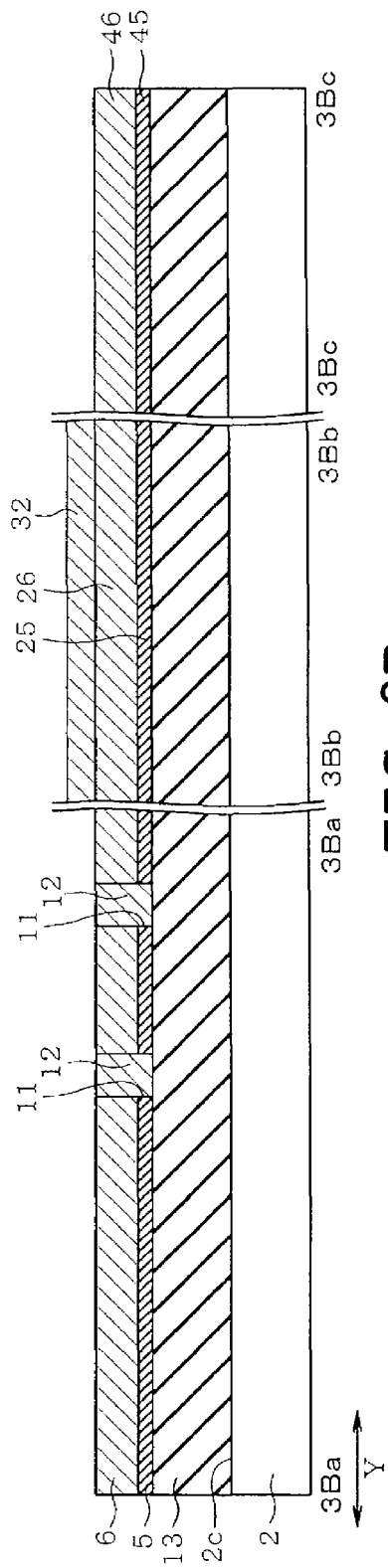

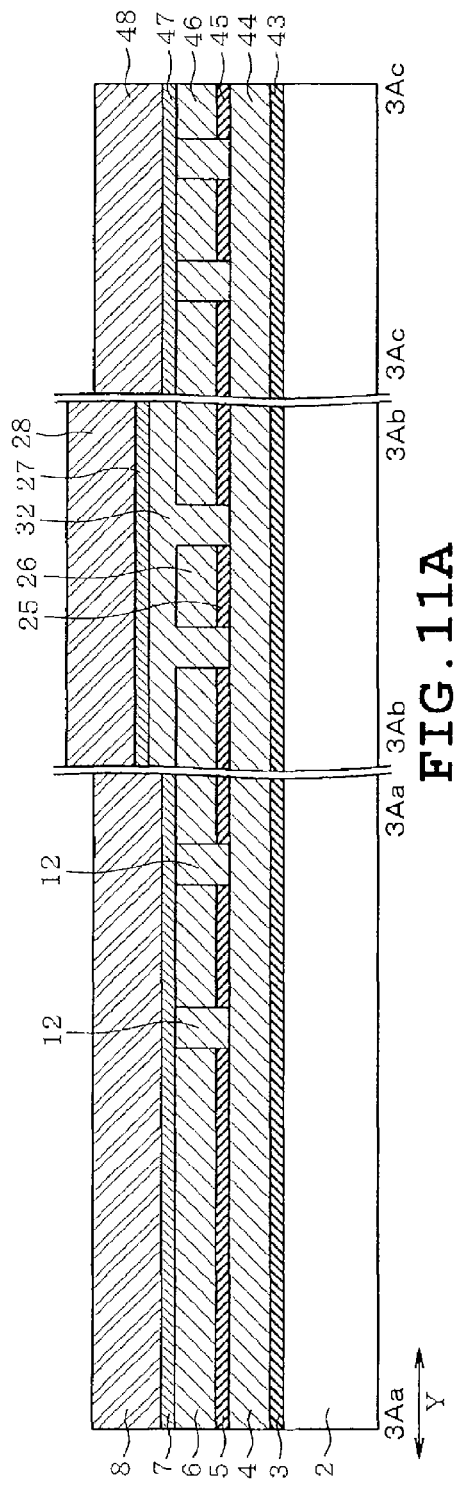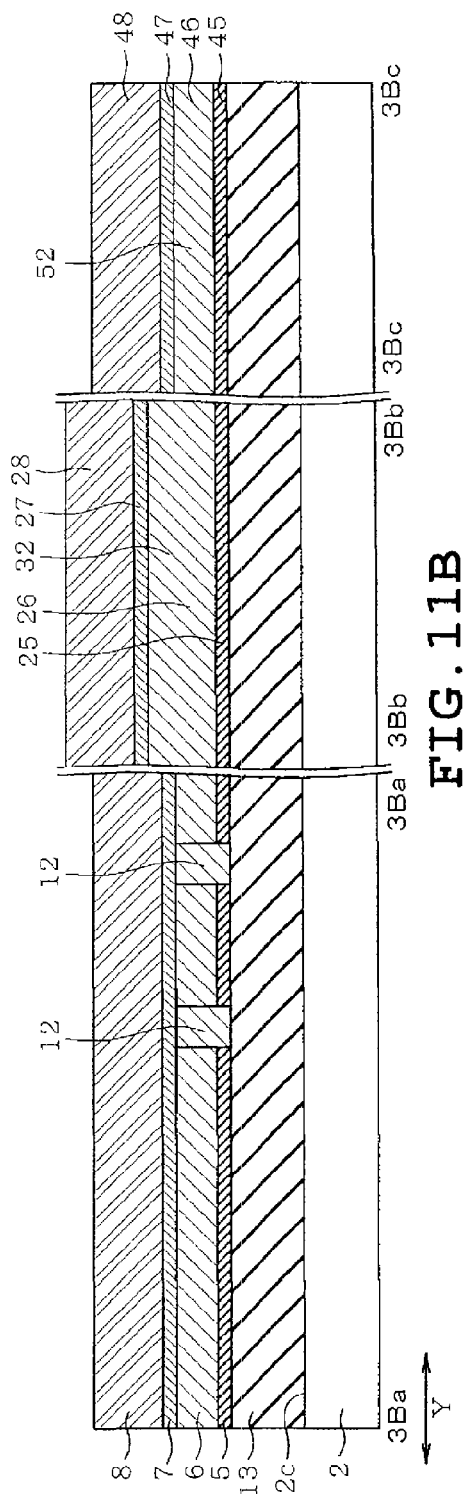

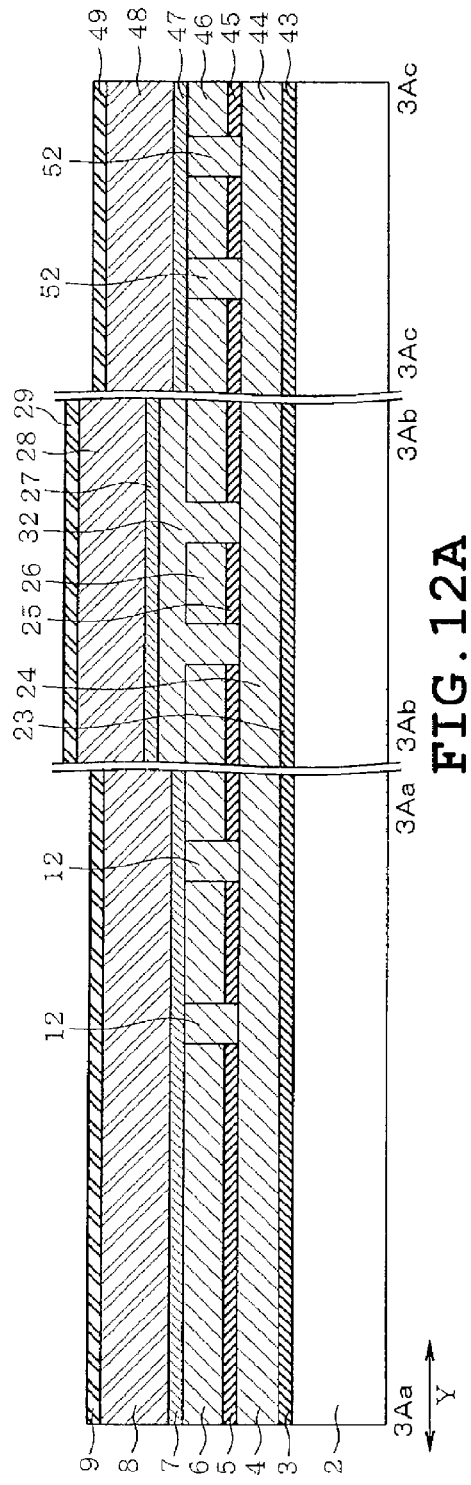
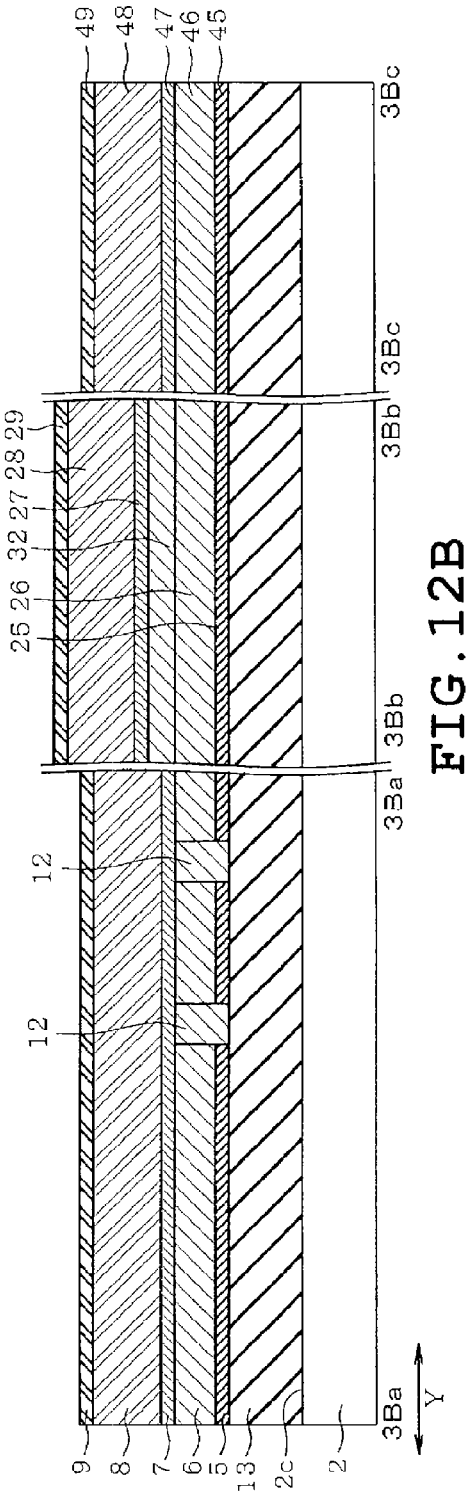
FIG.12A
FIG.12B

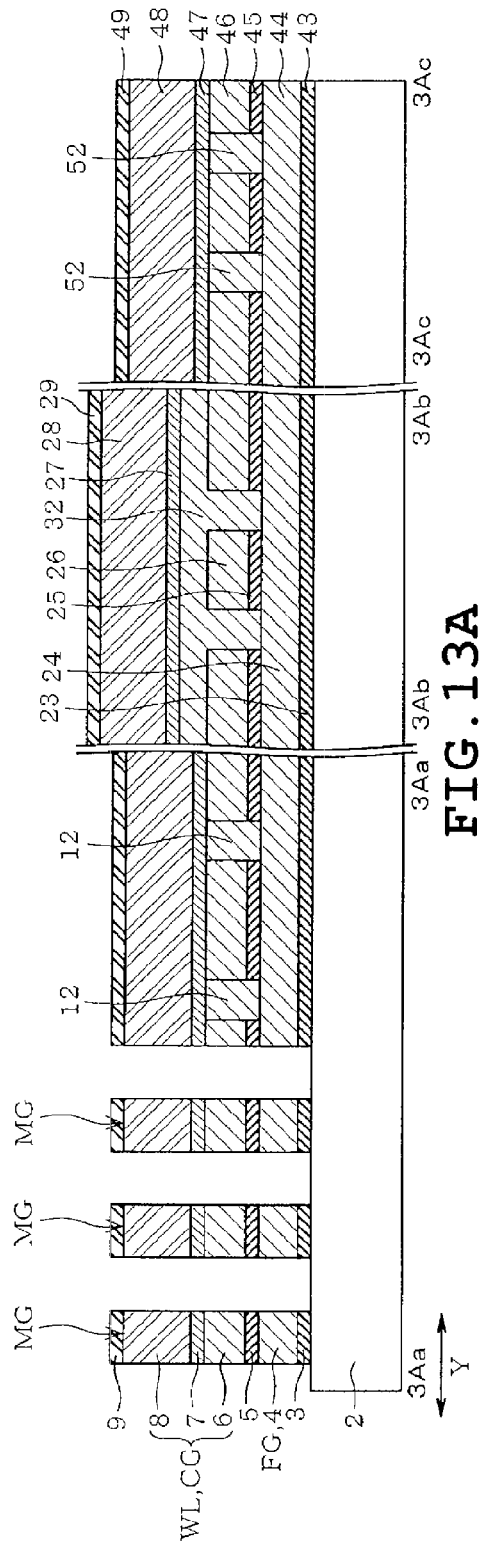
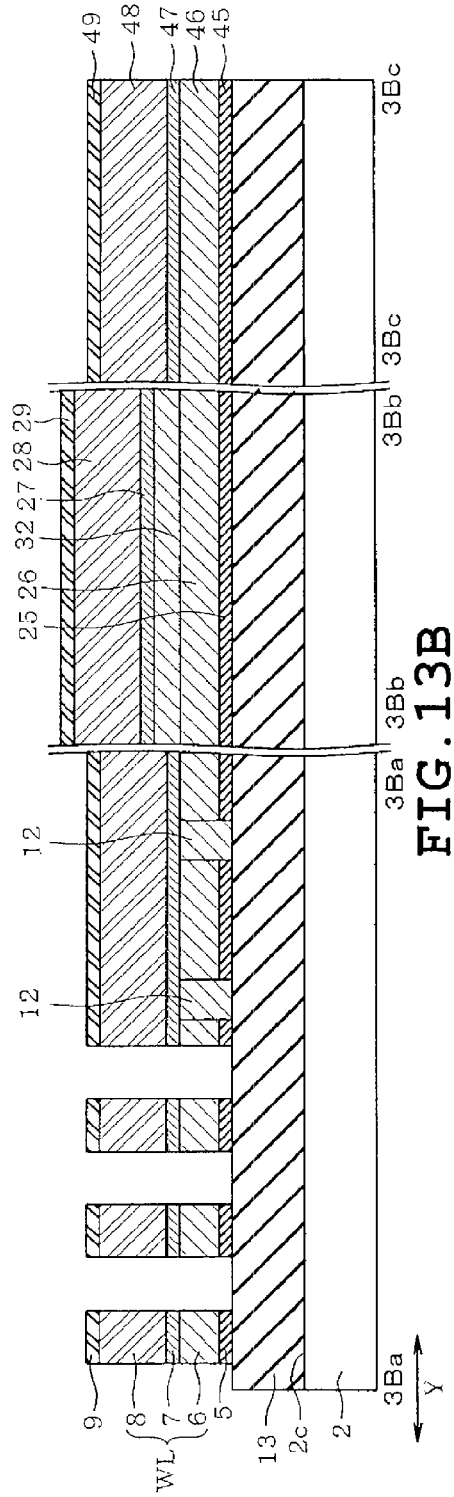
FIG. 13A
FIG. 13B

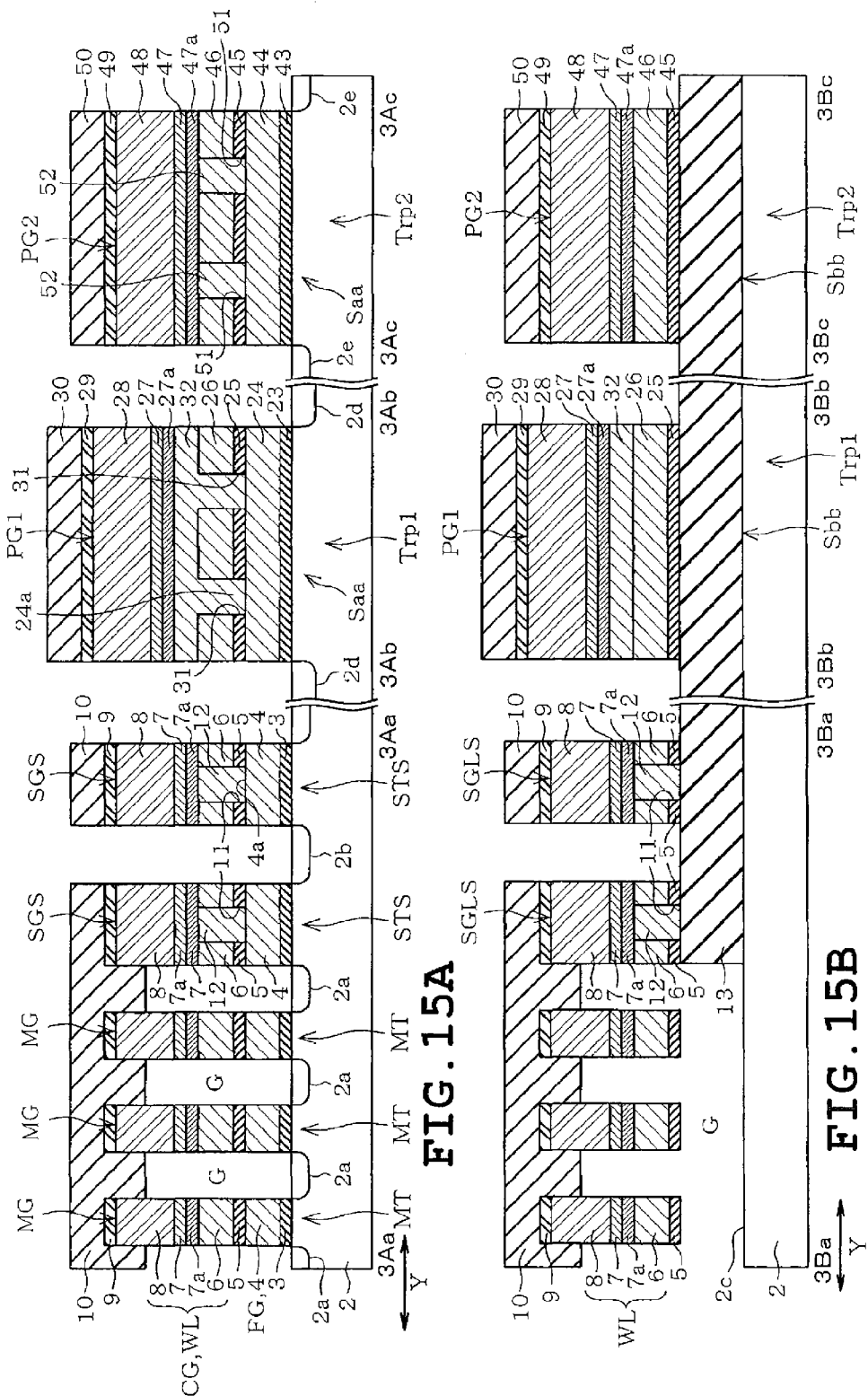

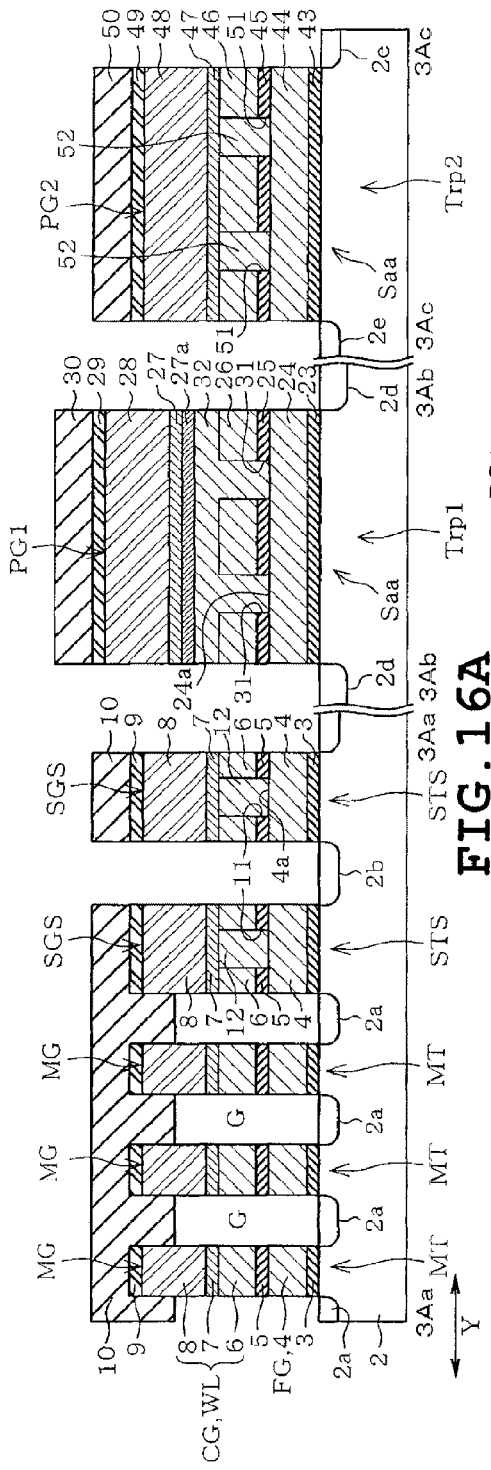
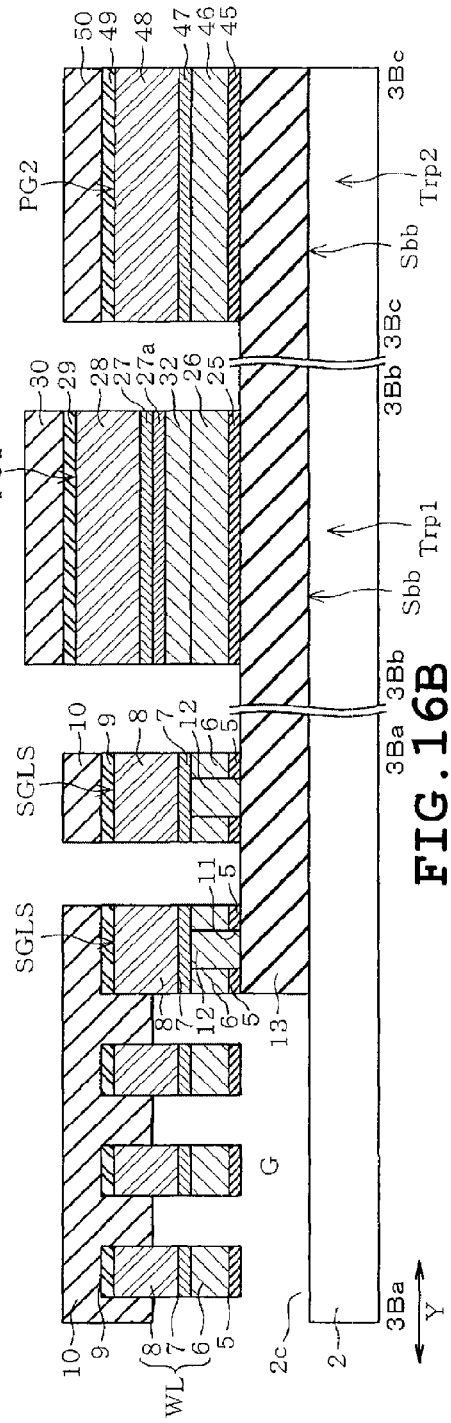
FIG. 16A
FIG. 16B

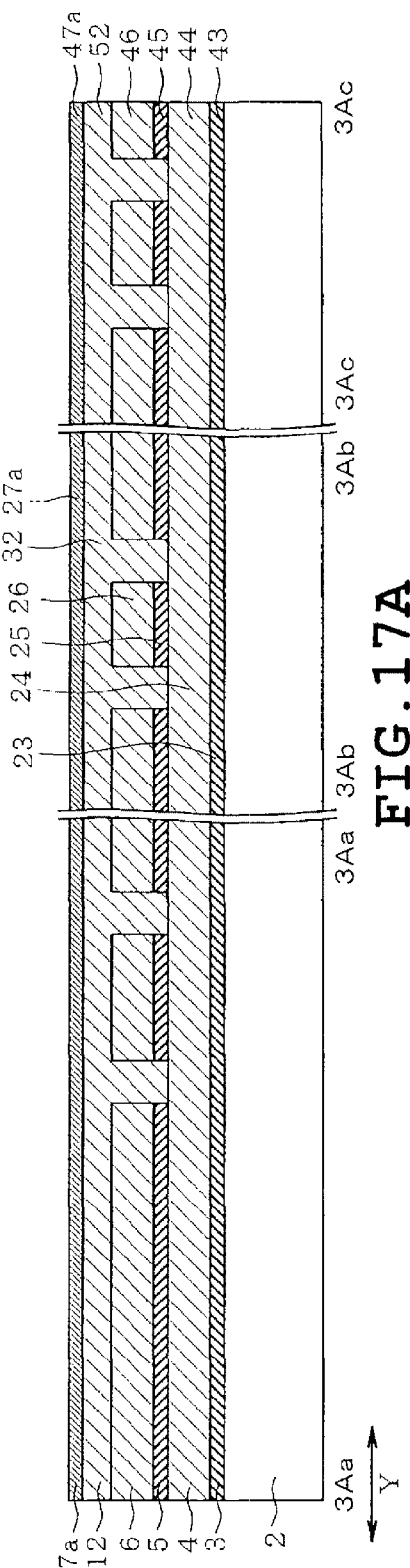
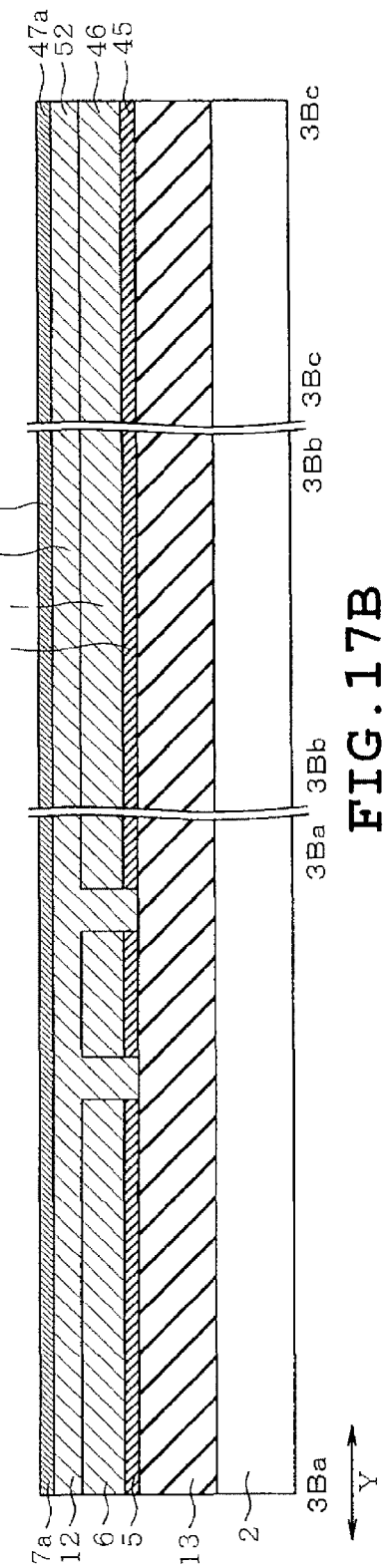
FIG. 17A
FIG. 17B

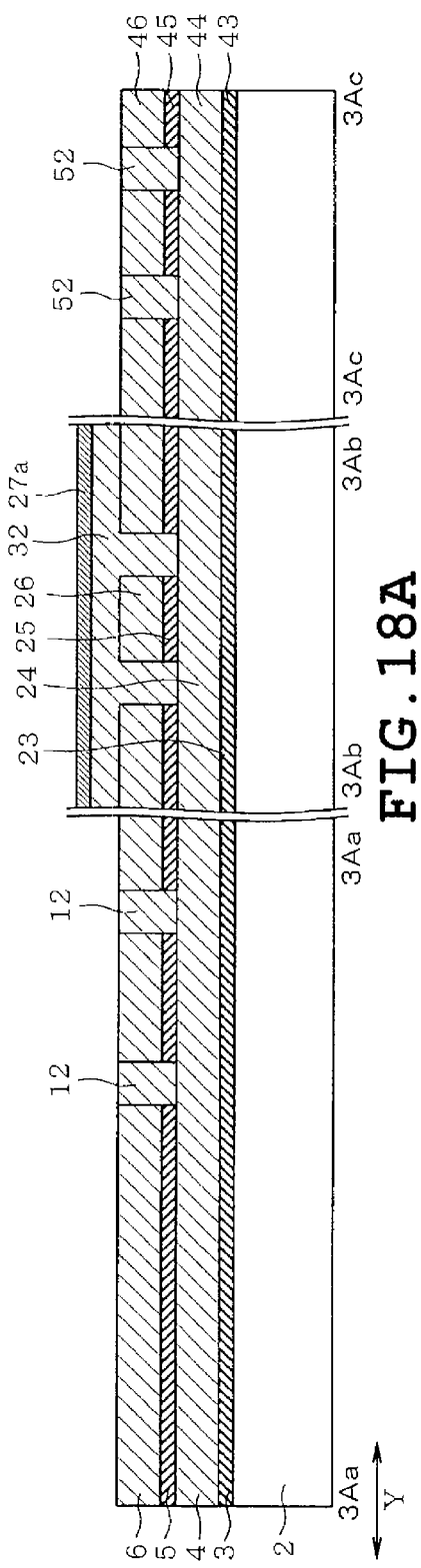
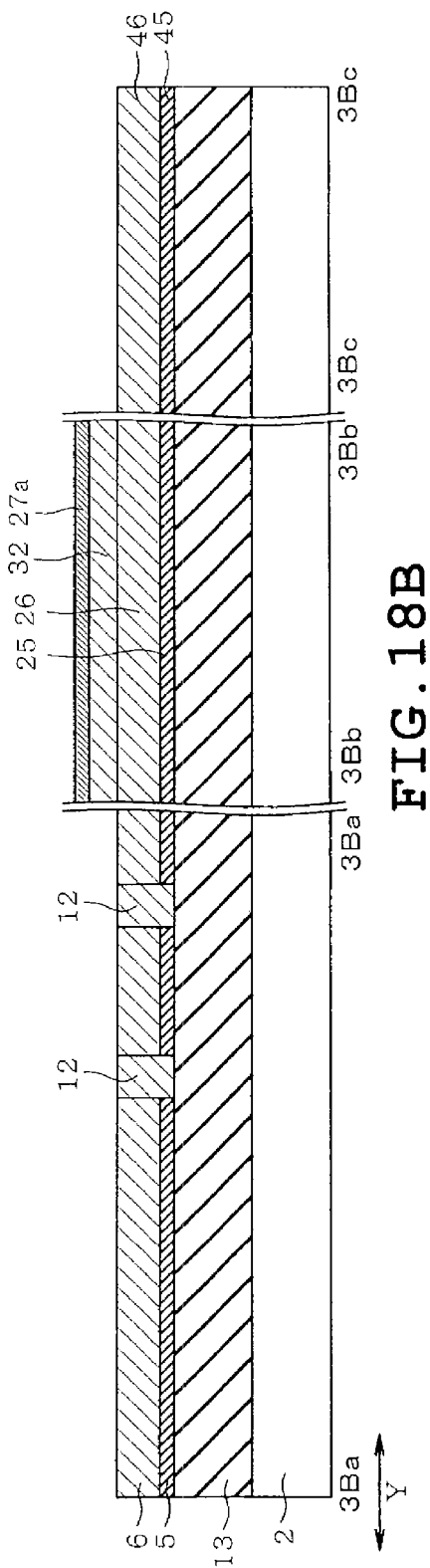

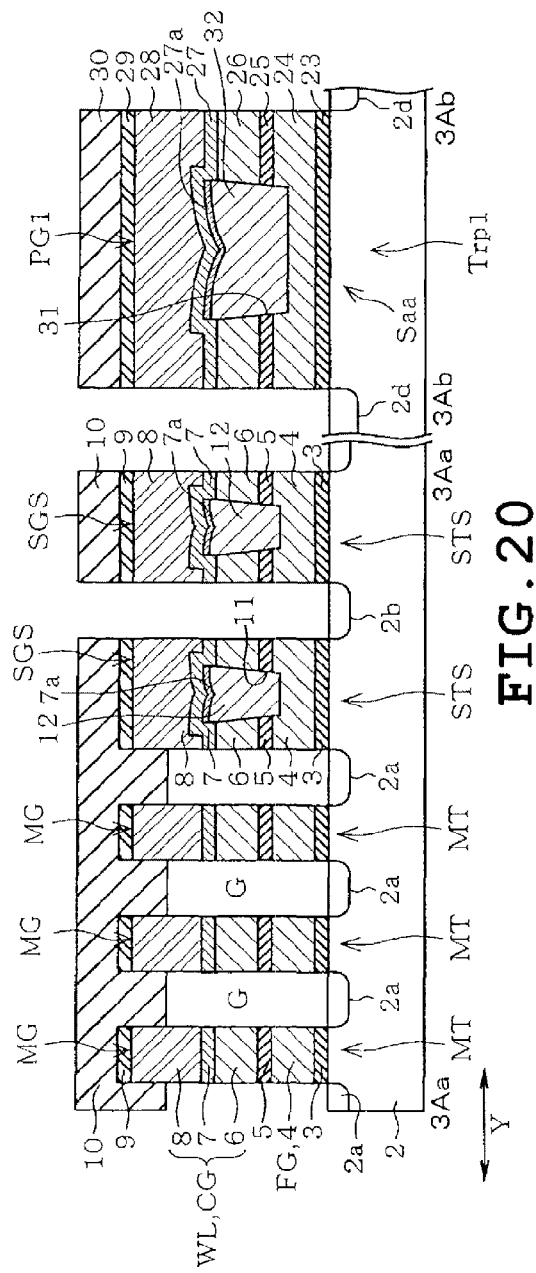
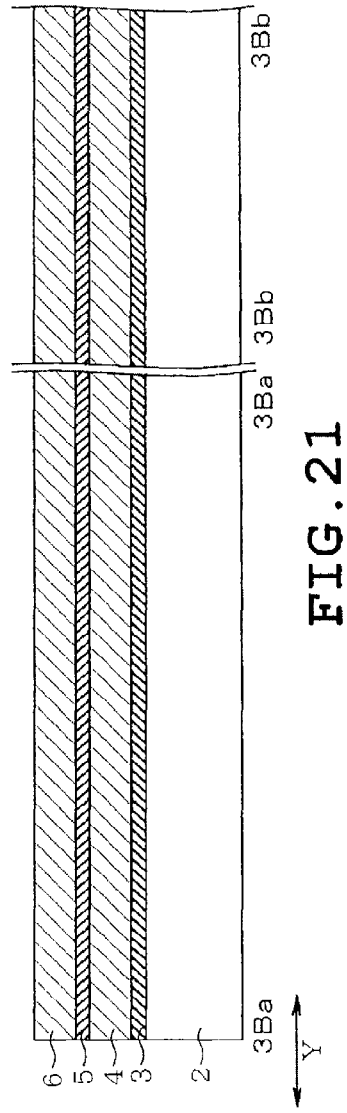
FIG. 20
FIG. 21

NONVOLATILE SEMICONDUCTOR MEMORY DEVICE COMPRISING MEMORY GATE AND PERIPHERAL GATE HAVING DIFFERENT THICKNESSES

CROSS-REFERENCE TO RELATED APPLICATION

This application is based upon and claims the benefit of priority from U.S. Provisional Patent Application No. 61/951,941, filed Mar. 12, 2014, the entire contents of which are incorporated herein by reference.

FIELD

Embodiments described herein relate to a nonvolatile semiconductor memory device.

BACKGROUND

As a nonvolatile semiconductor memory device, a flash memory device which stores information in a non-volatile manner by storing a charge in a charge storage layer such as a floating electrode or a trap layer, for example, has been developed. The nonvolatile semiconductor memory device includes a memory element which stores information in a non-volatile manner, and a peripheral element, which is an element other than the memory element. Examples of the peripheral element include a select transistor for selecting a memory element for reading thereof, writing thereto, or erasing thereof, and a transistor configuring a peripheral circuit for driving, i.e., providing a charge to, the memory element.

To achieve high speed writing and erasing of the memory elements, the gate electrode resistance must be low. For ease and simplicity of manufacturing, the memory element and the transistor of the peripheral circuit are often formed at the same time. However, the gate electrode of each element has a different optimal structure for the memory element transistors as compared to that for the transistor of the peripheral circuit.

DESCRIPTION OF THE DRAWINGS

FIG. 3A is an example of a schematic longitudinal cross-sectional side view taken along line 3Aa-3Aa of FIG. 2A, line 3Ab-3Ab of FIG. 2B, and line 3Ac-3Ac of FIG. 2C in a first embodiment.

FIG. 3B is an example of a schematic longitudinal cross-sectional side view taken along line 3Ba-3Ba of FIG. 2A, line 3Bb-3Bb of FIG. 2B, and line 3Bc-3Bc of FIG. 2C in a first embodiment.

FIGS. 4A, 5A, 6A, 7A, 8A, 9A, 10A, 11A, 12A, 13A, and 14A are examples of a longitudinal cross-sectional side view taken along line 3Aa-3Aa of FIG. 2A, line 3Ab-3Ab of FIG. 2B, and line 3Ac-3Ac of FIG. 2C and schematically illustrating one manufacturing stage according to a first embodiment.

FIGS. 4B, 5B, 6B, 7B, 8B, 9B, 10B, 11B, 12B, 13B, and 14B are examples of a longitudinal cross-sectional side view taken along line 3Ba-3Ba of FIG. 2A, line 3Bb-3Bb of FIG. 2B, and line 3Bc-3Bc of FIG. 2C schematically illustrating one manufacturing stage according to the first embodiment.

FIG. 15A is an example of a schematic longitudinal cross-sectional side view taken along line 3Aa-3Aa of FIG. 2A, line 3Ab-3Ab of FIG. 2B, and line 3Ac-3Ac of FIG. 2C according to a second embodiment.

FIG. 15B is an example of a schematic longitudinal cross-sectional side view taken along line 3Ba-3Ba of FIG. 2A, line 3Bb-3Bb of FIG. 2B, and line 3Bc-3Bc of FIG. 2C according to the second embodiment.

FIG. 16A is an example of a schematic longitudinal cross-sectional side view taken along line 3Aa-3Aa of FIG. 2A, line 3Ab-3Ab of FIG. 2B, and line 3Ac-3Ac of FIG. 2C according to a third embodiment.

FIG. 16B is an example of a schematic longitudinal cross-sectional side view taken along line 3Ba-3Ba of FIG. 2A, line 3Bb-3Bb of FIG. 2B, and line 3Bc-3Bc of FIG. 2C according to the third embodiment.

FIGS. 17A and 18A are examples of a longitudinal cross-sectional side view taken along line 3Aa-3Aa of FIG. 2A, line 3Ab-3Ab of FIG. 2B, and line 3Ac-3Ac of FIG. 2C schematically illustrating one manufacturing stage according to the third embodiment.

FIGS. 17B and 18B are examples of a longitudinal cross-sectional side view taken along line 3Ba-3Ba of FIG. 2A, line 3Bb-3Bb of FIG. 2B, and line 3Bc-3Bc of FIG. 2C schematically illustrating one manufacturing stage according to the third embodiment.

FIG. 20 is an example of a schematic longitudinal cross-sectional side view taken along line 3Aa-3Aa of FIG. 2A and line 3Ab-3Ab of FIG. 2B according to a fifth embodiment.

FIG. 21 to FIG. 29 are examples of a longitudinal cross-sectional side view taken along line 3Aa-3Aa of FIG. 2A and line 3Ab-3Ab of FIG. 2B schematically illustrating one manufacturing stage according to the fifth embodiment.

DETAILED DESCRIPTION

Figure 1:
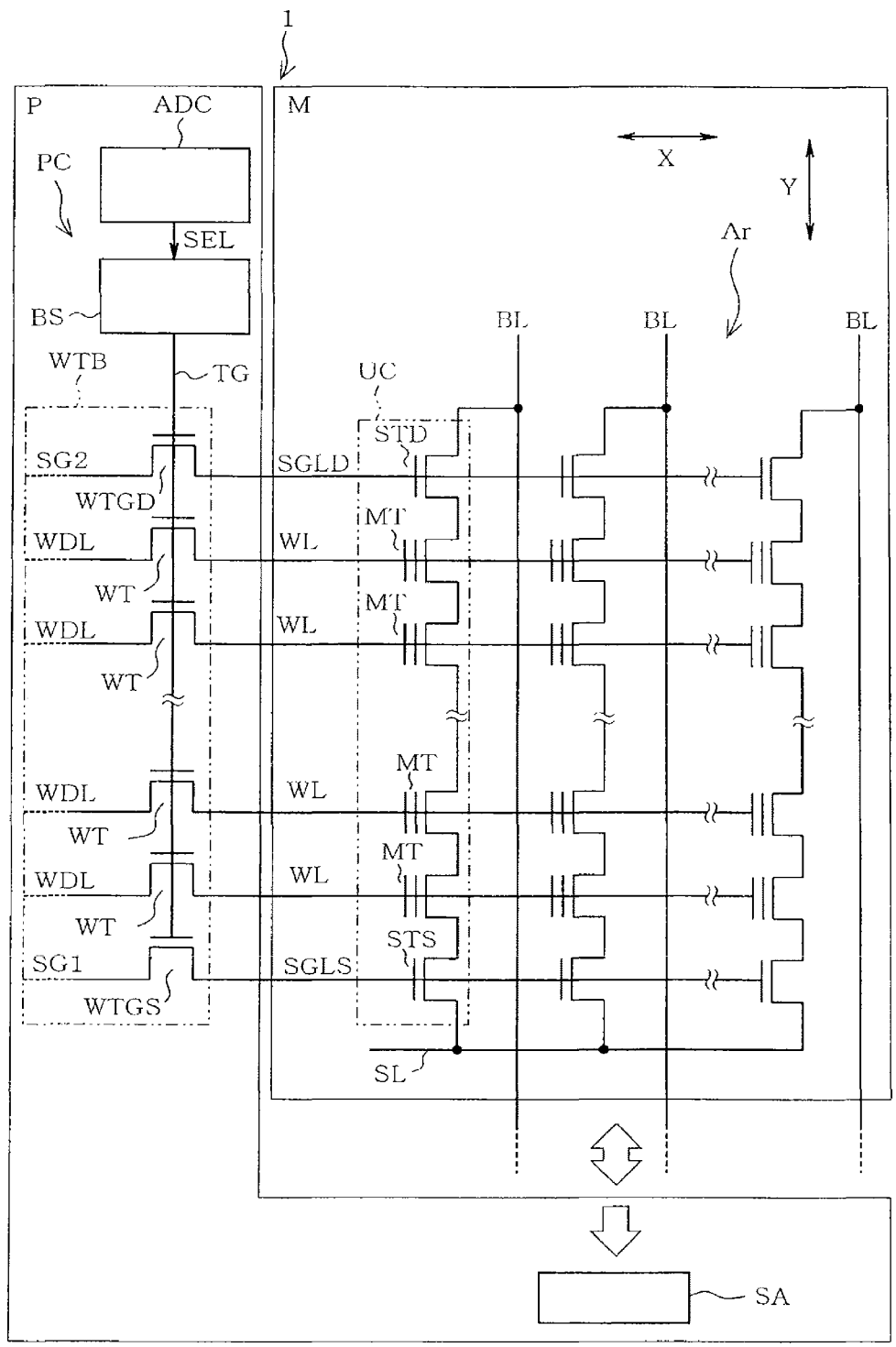
FIG. 1 is an example of a circuit diagram schematically illustrating an example of an electrical configuration in all embodiments.

In general, according to one embodiment, a nonvolatile semiconductor memory device includes a semiconductor substrate, a memory element including a first gate electrode having a first thickness disposed on a first insulation film on the semiconductor substrate, and a first peripheral element other than a memory element including a second gate electrode having a second thickness disposed on a second insulation film on the semiconductor substrate. The first gate electrode and second gate electrode comprise a plurality of film layers, and the configuration of the film layers are different as between the first gate electrode of the memory element and the second gate electrode of the peripheral element, and the first thickness is different from the second thickness.

According to another embodiment, there is provided a nonvolatile semiconductor memory device including: a semiconductor substrate; a memory element which includes a first gate electrode having a first height or thickness; and a peripheral element other than the memory element which includes a second gate electrode having a second height or thickness, in which the first gate electrode of the memory element includes a first structure configured with a first electrode film, a first inter-electrode insulation film, and a first electrode structure all located on a first insulation film on the semiconductor substrate, the second gate electrode of the peripheral element includes a second structure including a second electrode film, a second inter-electrode insulation film, and a second electrode structure which is embedded in an opening penetrating the second inter electrode insulation film and reaching the inside of the second electrode film and which is located on a second inter-electrode insulation film which is located on the second insulation film located on the semiconductor substrate, and the first height of the first gate electrode is different from the second height of the second gate electrode, and the first electrode structure directly above the first inter-electrode insulation film is configured to be different from the second electrode structure directly above the second inter-electrode insulation film.

Hereinafter, the embodiments will be described with reference to the drawings using a NAND type flash memory device as the nonvolatile semiconductor memory device. The drawings are schematically shown and a relationship between a thickness and a planar dimension, the ratios of thicknesses of each layer, and the like do not necessarily coincide with actual values in an actual device. In addition, upward, downward, right, and left directions relative to the circuit forming surface side of a semiconductor substrate which will be described later as an upper side, and do not necessarily coincide with examples using the direction of gravitational acceleration as a reference. In the following description, an XYZ orthogonal coordinate system is used for convenience of the description. In the coordinate system, two directions which are generally parallel with respect to a surface (main surface) of the semiconductor substrate 2 and which are orthogonal with each other are set as an X direction and a Y direction, and a direction which is orthogonal with respect to both of the X direction and the Y direction is set to a Z direction.

First Embodiment

Hereinafter, FIG. 1 to FIG. 14B illustrate a first embodiment. FIG. 1 is a block diagram of an example schematically illustrating an electric configuration of a NAND type flash memory device. As illustrated in FIG. 1, a NAND type flash memory device 1 includes a memory cell array Ar in which a plurality of memory cells MT are disposed in matrix form, i.e., the memory cells MT extend and are spaced in the X and Y direction in a memory cell area M, and includes a peripheral circuit PC in a peripheral circuit area P which performs reading, writing, and erasing for each memory cell of the memory cell array Ar.

A plurality of cell units UC are disposed in the memory cell array Ar in the memory cell area M. In each of the cell units UC, a select transistor STD connected to a bit line BL, a select transistor STS connected to a source line SL, and memory cells MT (corresponding to memory elements) which are, for example, 64 (=m) memory elements MT located between the two selecting transistors STD and STS are connected in series. In one block, n columns of cell units UC are disposed in parallel and spaced in the X direction (row direction: horizontal direction in FIG. 1). The memory cell array Ar is configured with a plurality of blocks disposed and connected in a Y direction (column direction). Only one block is illustrated in FIG. 1 in order to simplify the description.

The peripheral circuit area P is provided on the periphery of, i.e., directly adjacent to, the memory cell area M, and a peripheral circuit PC is disposed in the peripheral area P on the periphery of the memory cell array Ar. The peripheral circuit PC includes an address decoder ADC, a sense amplifier SA, a booster circuit BS including a charge pump circuit, a transfer transistor unit WTB, and the like. The address decoder ADC is electrically connected to the transfer transistor unit WTB through the booster circuit BS.

The address decoder ADC selects one block of the memory cell array Ar based upon an address signal applied thereto from the outside. The booster circuit BS boosts the driving voltage supplied from the outside when a selection signal for the block is applied thereto, and then supplies a predetermined voltage to transfer gate transistors WTGD, WTGS, and WT through a transfer gate line TG. The transfer transistor unit WTB includes the transfer gate transistor WTGD, the transfer gate transistor WTGS, and the word line transfer gate transistor WT. A transfer transistor unit WTB is provided to correspond to each block.

One of a drain or a source of the transfer gate transistor WTGD is connected to a select gate driver line SG2, and the other one thereof is connected to a select gate line SGLD. One of a drain or a source of the transfer gate transistor WTGS is connected to a select gate driver line SG1, and the other one thereof is connected to a select gate line SGLS. In addition, one of a drain or a source of the transfer gate transistor WT is connected to each word line driving signal line WDL, and the other one thereof is connected to each word line WL provided in the memory cell array Ar.

In the plurality of cell units UC spaced in the X direction, gate electrodes SGD of the select transistor STD (see FIG. 2A) are electrically connected through the select gate line SGLD. In addition, gate electrodes SGS of the select transistor STS (see FIG. 2A) are electrically connected through the select gate line SGLS. A source of the select transistor STS is commonly connected to the source line SL. In the plurality of memory cells MT of the cell units UC spaced in the X direction, the gate electrodes MG (see FIG. 2A) are electrically connected through the word line WL.

The gate electrodes of the transfer gate transistors WTGD, WTGS, and WT are commonly connected through the transfer gate line TG, and are thus connected to a boosting voltage supply terminal of the booster circuit BS. The sense amplifier SA is connected to the bit line BL, and is connected to a latch circuit for temporarily storing data when reading out the corresponding data from the memory cells MT.

Figure 2B:
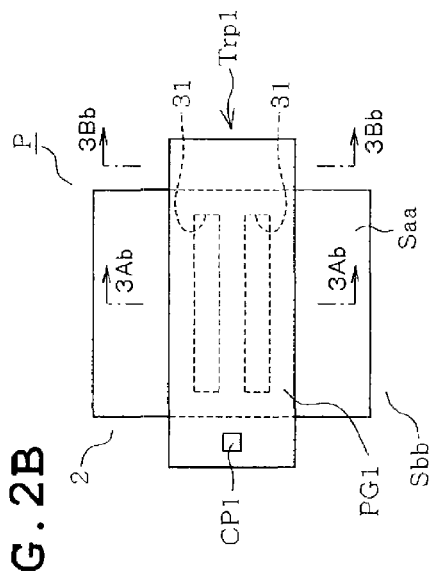
FIGS. 2B and 2C are examples of a plan view schematically illustrating an example of a structure of a peripheral transistor in a peripheral circuit area in all embodiments (Example 1 and Example 2).
Figure 2C:
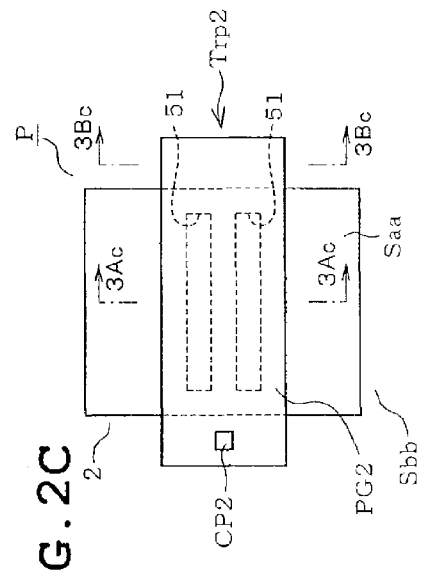
Figure 2A:
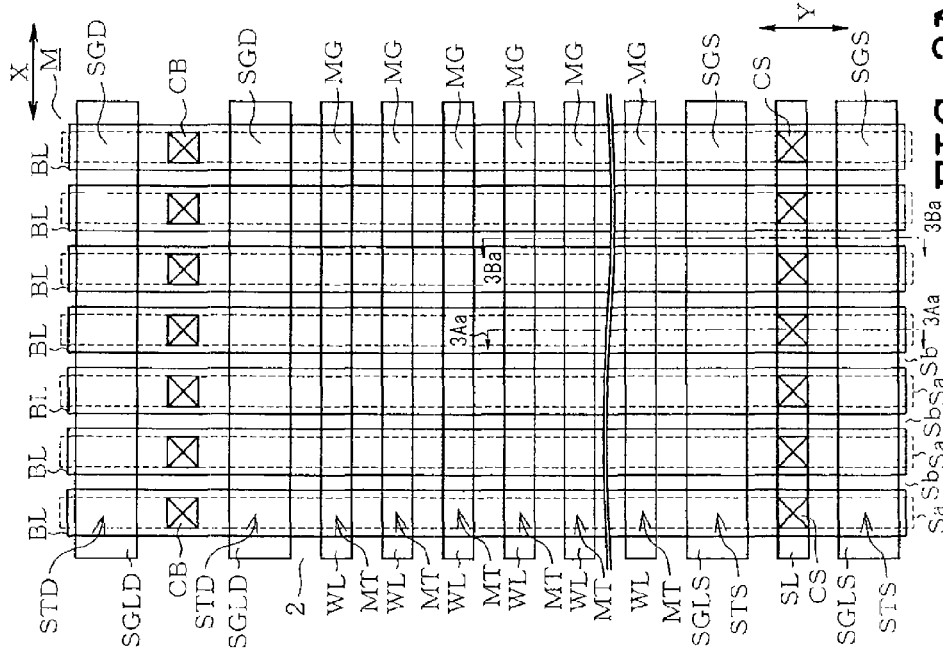
FIG. 2A is an example of a plan view schematically illustrating an example of a structure of a memory cell area in all embodiments.

FIG. 2A is an example of a layout pattern of a part of the memory cell area M. As illustrated in FIG. 2A, in the memory cell area M of a semiconductor substrate (for example, a p-type monocrystalline silicon substrate) 2, element isolation areas Sb having a shallow trench isolation (STI) structure configured with an element isolation film disposed in an isolation trench (see reference numeral 13 of FIG. 3B), are formed to extend along the Y direction of FIG. 2A, and are formed at predetermined intervals in the X direction as shown in FIG. 2A. Accordingly, a plurality of element areas Sa are formed in a surface layer portion of the semiconductor substrate 2 between adjacent element isolation areas Sb and they likewise extend in the Y direction in FIG. 2A and are separated from one another in the X direction by the element isolation areas Sb.

The word lines WL extend in a direction orthogonal to the longitudinal direction of the element areas Sa to cross the element areas (in the X direction in FIG. 2A). The plurality of word lines WL are formed, and thus spaced apart, at predetermined intervals in the Y direction in FIG. 2A. The gate electrodes MG of the memory cell MT are formed where the element areas Sa cross (overlie or underlie) the word lines WL.

One group of the memory cells MT disposed in the Y direction is formed a NAND string. The select transistors STD and STS are located at opposite ends, in the Y direction, of the plurality of memory cells MT of the NAND string. The plurality of select transistors STD are disposed in the X direction, and the gate electrode SGD of the plurality of select transistors STD are electrically connected to the select gate line SGLD. The gate electrode SGD of the select transistor STD is formed on the element area Sa where it crosses (overlies or underlies) the selecting gate line SGLD.

FIG. 2B and FIG. 2C illustrate examples of the physical layout of transistors Trp1 and Trp2 in plan view, which are peripheral circuit elements in the peripheral circuit area P. Since the structure of the transistors Trp1 and Trp2 are substantially the same, only a plan view of the transistor Trp1 of FIG. 2B will be described, and only the differences between the transistor Trp2 and transistor Trp2 will be described.

An element isolation area Sbb is formed extending into the substrate and filled with an isolation material, so as to form an isolated rectangular element area Saa on the semiconductor substrate 2. The transistors Trp1 formed on the peripheral circuit area P is provided in this rectangular element area Saa. A gate electrode PG1 crosses over and is spaced from the element area at the element area Saa, and a diffusion area (no reference numeral) formed with diffused dopants is provided in the element area Saa on either side of the location where the gate electrode PG1 crosses over the element area Saa. A gate contact CP1 is provided on the gate electrode PG1. The gate contact CP1 contacts an upper surface of the gate electrode PG1, and this contact area is in an area directly above the element isolation area Sbb as shown in plan view in FIG. 2B.

In the same manner as described above, and as illustrated in FIG. 2C, a gate electrode PG2 which crosses over and is spaced from the element area Saa of the transistor Trp2. A gate contact CP2 is provided on the gate electrode PG2. The gate contact CP2 contacts an upper surface of the gate electrode PG2, and this contact area is directly above the element isolation area Sbb in plan view.

FIG. 3A and FIG. 3B schematically illustrate examples of cross-sectional structures of elements in the memory cell area and the peripheral circuit area of the semiconductor substrate 2. FIG. 3A is an example of schematic cross-sectional side view taken along line 3Aa-3Aa of FIG. 2A, line 3Ab-3Ab of FIG. 2B, and line 3Ac-3Ac of FIG. 2C. FIG. 3B is an example of a schematic cross-sectional side view taken along line 3Ba-3Ba of FIG. 2A, line 3Bb-3Bb of FIG. 2B, and line 3Bc-3Bc of FIG. 2C. Among them, the part of FIG. 3A taken along line 3Aa-3Aa and the part of FIG. 3B taken along line 3Ba-3Ba schematically illustrate cross-sectional structures of the memory cells MT and the select transistor STS in the memory cell area M.

The part of FIG. 3A taken along line 3Ab-3Ab and the part of FIG. 3B taken along line 3Bb-3Bb schematically illustrate cross-sectional structures of the transistor Trp1 of the peripheral circuit area P. The part of FIG. 3A taken along line 3Ac-3Ac and the part of FIG. 3B taken along line 3Bc-3Bc schematically illustrate cross-sectional structures of the transistor Trp2 of the peripheral circuit area P. FIG. 3A and FIG. 3B illustrate the final form of each gate electrode of the memory cell MT, the selecting transistor STD, and the transistors Trp1 and Trp2.

As illustrated in FIG. 3A, a gate insulation film 3 is formed on the upper surface of the semiconductor substrate 2. This gate insulation film 3 is formed of a silicon oxide film or the like, for example. The gate electrodes MG of the memory cells MT and the gate electrodes SGD of the selecting transistor STD are formed on the upper (non semiconductor substrate 2 facing) surface of the gate insulation film 3.

The gate electrodes MG of the memory cells MT are formed on the upper surface of the gate insulation film 3 at predetermined intervals, and the gate electrodes MG of the memory cells MT and the gate electrode SGS of the selecting transistor STS are formed at predetermined intervals at the end of a series of memory cells MT in a string. The memory cell MT is configured to include the gate electrode MG and source and drain areas 2a formed in the semiconductor substrate 2 on either side thereof. The plurality of memory cells MT are formed to be adjacent to, and spaced from, each other in the Y direction (see FIG. 2A).

The select transistors STS are formed adjacent to the end portion of a string of memory cells MT. The gate electrodes SGS of the select transistors STS in FIG. 3A are formed for the select transistor STS of the block which is adjacent to the string of memory cells MT with which it is associated and spaced therefrom at a predetermined interval. Only the structure of the select transistor STS is illustrated, and the structure of the select transistor STD is the same structure as the structure of the selecting transistor STS.

A source line contact CS (see FIG. 2A and not illustrated in FIG. 3A) is formed to contact a diffusion area 2b between each pair of select transistors STS. In the gate electrode MG of the memory cell MT, a first electrode film 4, an inter-electrode insulation film 5, a second electrode film 6, a barrier metal film 7, and a metal film 8 are stacked one over the other in this order from the gate insulation film 3, and an insulation film 9 is formed on the metal film 8. The insulation film 9 is configured as a silicon nitride film, for example.

The first electrode film 4 is formed of a p-type polysilicon film in which a p-type dopant (for example, boron (B) is introduced, for example, and is configured as a floating electrode FG in the memory cell MT. As the first electrode film 4, the embodiment using a polysilicon film to which a p-type dopant is introduced is illustrated. When boron (B) is doped, for example, a p-type dopant concentration of approximately $1 \times 10^{20}$ to $10^{22}$ [atoms/cm$^3$] is created. An n-type dopant (for example, phosphorus (P)) may be introduced, although other n and p type dopants may be used. Phosphorus (P) may be slightly doped as the n-type dopant. The concentration of phosphorus in the first electrode film 4 is approximately $1 \times 10^{15}$ to $10^{17}$ [atoms/cm$^3$], for example. The dopant concentration in the polysilicon film may be measured by secondary ion mass spectrometry (SIMS) analysis.

An oxide-nitride-oxide (ONO) film, a nitride-oxide-nitride-oxide-nitride (NONON) film, or a film obtained by substituting a nitride film in the middle with an insulation film having high-dielectric constant (High-K film: for example, alumina or hafnia) may be used as the interelectrode insulation film 5.

The second electrode film 6 is formed of a p-type polysilicon film to which a p-type dopant (for example, boron (B)) is introduced, for example. The embodiment using the polysilicon film to which the p-type dopant is introduced as the second electrode film 6 is illustrated, but the polysilicon film to which an n-type dopant (for example, phosphorus (P)) is slightly introduced may be used.

The barrier metal film 7 is configured as a tungsten nitride (WN) film, for example. The metal film 8 is configured as a tungsten (W) film, for example. The second electrode film 6, the barrier metal film 7, and the metal film 8 are configured as control electrodes CG (word line WL). In the surface layer of the semiconductor substrate 2, the source and drain areas 2a are provided between adjacent gate electrodes MG and MG, and between the gate electrodes SGS and MG. The diffusion area 2b to which a dopant is diffused is provided between the gate electrodes SGS and SGS.

The gate electrode SGS of the selecting transistor STS has substantially the same structure as the structure of the gate electrode MG of the memory cell MT. In the gate electrode SGS, the first electrode film 4, the interelectrode insulation film 5, the second electrode film 6, the barrier metal film 7, and the metal film 8 are formed in this order on the gate insulation film 3. In the gate electrode SGS, an opening 11 having a predetermined width dimension is provided in the center of the second electrode film 6 and the interelectrode insulation film 5, and the third electrode film 12 is embedded in this opening 11 to contact the first electrode film 4. The third electrode film 12 is configured with a p-type polysilicon film to which a p-type dopant (for example, boron (B)) is introduced, for example. The embodiment using the polysilicon film to which the p-type dopant is introduced as the third electrode film 12 is illustrated, but the polysilicon film to which an n-type dopant (for example, phosphorus (P)) is introduced may be used.

This third electrode film 12 is an electrode film which electrically connects the first electrode film 4 and the barrier metal film 7 through the opening 11, and accordingly, the first electrode film 4 and the metal film 8 are electrically connected to each other, and thus the select gate electrode SGS becomes an integral gate electrode. The upper surface of the third electrode film 12 and the upper surface of the second electrode film 6 substantially coincide with each other and are formed to be flat. Therefore, in the selecting gate electrode SGS, the third electrode film 12 is not formed on the upper surface of the second electrode film 6, and as a result, the barrier metal film 7 on the upper surface of the third electrode film 12 is formed with substantially the same film thickness. In addition, the barrier metal film 7 is formed to be substantially flat. A gap G is provided between the gate electrodes MG and MG, and between gates SGS and MG. In the same manner as the gate electrode MG, the insulation film 9 is formed on the metal film 8 of the gate electrode SGS. The insulation film 9 is formed as a silicon nitride film, for example. An insulation film 10 is formed to extend over the gaps G so as to also cover the gate electrodes MG and SGS. This insulation film 10 is formed of a silicon oxide film, for example.

In the cross section taken along line 3Ba-3Ba of FIG. 2A shown in FIG. 3B, the word lines WL are shown in section in the area between the gate electrodes MG adjacent to each other in the X direction, and adjacent gate electrodes MG are connected to each other through the word lines WL, and the select gate electrodes SGS adjacent to each other in the X direction are connected to each other through the select gate lines SGLS.

In this cross section, the word line WL is formed above the semiconductor substrate 2 and spaced therefrom by gap G and the interelectrode insulation film 5. A groove 2c is formed in the semiconductor substrate 2 to form separated element regions Saa, and the gap G is provided between the word lines WL and WL, and word lines WL and the select gate line SGLS, and the inter-electrode insulation film 5 and the substrate 2. Accordingly, parasitic capacitance between the word lines WL and WL, and word lines WL and the selecting gate line SGLS may be suppressed.

The select gate line SGLS connects together the select gate electrodes SGS of a single block described above, but in the cross section taken along line 3Ba-3Ba of FIG. 2A and as shown in FIG. 3B, an element isolation film 13 is formed in the groove 2c extending into the semiconductor substrate 2 in regions other than between the word lines WL and the semiconductor substrate 2. This element isolation film 13 is formed of silicon oxide, for example.

On the element isolation film 13, the second electrode film 6, the barrier metal film 7, and the metal film 8 configuring the selecting gate line SGLS are provided in that order over the inter-electrode insulation film 5. In the same manner as the cross section illustrated in FIG. 3A, the opening 11 is formed in the second electrode film 6 and the interelectrode insulation film 5, and the third electrode film 12 is provided in this opening 11. In the cross section taken along line 3Ba-3Ba of FIG. 3B, this third electrode film 12 is formed directly on the upper surface of the element isolation film 13.

Next, the structure of the transistor Trp1 will be described with reference to the cross sections taken along line 3Ab-3Ab of FIG. 2B as shown in FIG. 3A and line 3Bb-3Bb of FIG. 2B as shown in FIG. 3B. The transistor Trp1 includes a gate electrode PG1 and source and drain areas 2d formed in the surface layer of the semiconductor substrate 2 on both sides of the gate electrode PG1. Herein, a depth of the source and drain areas 2d is deeper than a depth of the source and drain areas 2a. The "depth" is a depth into the semiconductor substrate from the surface of the semiconductor substrate 2 contacted by the gate insulation film 23 and gate insulating film 3.

The gate electrode PG1 has substantially the same configuration as the gate electrode SGS of the select transistor STS. In the transistor Trp1, the gate insulation film 23 is formed on the element area Saa. This gate insulation film 23 is formed of a silicon oxide film, for example, and may be formed having a different film thickness than other gate insulating films, such as gate insulating film 3, in accordance with the requirements the transistor Trp1. The gate electrode PG1 is formed on the gate insulation film 23.

For the gate electrode PG1, a first electrode film 24, an interelectrode insulation film 25, a second electrode film 26, a third electrode film 32, a barrier metal film 27, and a metal film 28 are formed on the gate insulation film 23 in that order. An insulation film 29 and an insulation film 30 are formed on the metal film 28. The first electrode film 24 is configured as an n-type polysilicon film into which an n-type dopant (for example, phosphorus (P) or arsenic (As)) is introduced, for example. The embodiment in which the n-type dopant is introduced to the first electrode film 24 is illustrated, but a p-type dopant may be introduced therein. As an example, both the n-type dopant and the p-type dopant may be doped into the first electrode film 24. In this case, phosphorus (P) or arsenic (As) and boron (B) are doped to the first electrode film 24 as the dopant, for example. Phosphorus or arsenic is doped into the first electrode film 24 with concentration of approximately $1 \times 10^{20}$ to $10^{22}$ [atoms/cm$^3$], for example. Boron (B) is doped into the first electrode film 24 with concentration of approximately $1 \times 10^{19}$ [atoms/cm$^3$], for example. In such a case, the conductivity type of the first electrode film 24 is the n type, because the n-type dopant concentration is larger than the p-type dopant concentration.

The interelectrode insulation film 25 is configured with the same material as that of the interelectrode insulation film 5. The second electrode film 26 is configured as an n-type polysilicon film to which an n-type dopant (for example, phosphorus (P)) is introduced, for example. The embodiment in which the n-type dopant is introduced to the second electrode film 26 is illustrated, but a p-type dopant may be introduced thereto. The third electrode film 32 is configured as a polysilicon film into which an n-type dopant (for example, phosphorus (P)) is introduced, for example. The embodiment in which the n-type dopant is introduced to the third electrode film 32 is illustrated, but a p-type dopant may be introduced therein.

The barrier metal film 27 is configured with the same material (for example, tungsten nitride (WN)) as that of the barrier metal film 7. The metal film 28 is configured with the same material (for example, tungsten (W)) as that of the metal film 8. The insulation film 29 is configured with the same material (for example, silicon nitride film) as that of the insulation film 9. The insulation film 30 is configured with the same material (for example, silicon oxide film) as that of the insulation film 10.

In the gate electrode PG1, one or a plurality of openings 31 are provided through the inter-electrode insulation film 25 and the second electrode film 26. The openings 31 are provided in order to allow the third electrode film to extend through the openings in the second electrode film 26 and the interelectrode insulation film 25 to contact the upper surface of the first electrode film 24. In addition, this opening 31 is not formed on the upper surface of the element isolation film 13 (see FIG. 2B and FIG. 3B). The third electrode film 32 thus extends inwardly of the opening 31.

The third electrode film 32 is an electrode film which electrically connects the first electrode film 24 and the barrier metal film 27 through the openings 31, and accordingly, the first electrode film 24 and the metal film 28 are electrically connected to each other, and thus the gate electrode PG1 becomes an integral gate electrode. The upper surface of the third electrode film 32 is formed to be flat. In addition, in the gate electrode PG1, the third electrode film 32 is also formed on the upper surface of the second electrode film 26. Herein, a film thickness of the third electrode film 32 formed on the upper surface of the second electrode film 26 is a film thickness dl.

The gate width and gate length of the peripheral transistors Trp1 may be wider than a gate width and a gate length of the select transistors STS, respectively. As a result, a width of the opening 31 of the peripheral transistor Trp1 is wider than the opening 11 in the select transistors STS, or the number of the openings 31 is increased as compared to those in the select gate transistors STS, based on the gate width and the gate length of the peripheral transistor, and therefore it is possible to decrease contact resistance between the first and third electrode films 24 and 32.

In the cross section taken along line 3Bb-3Bb of FIG. 2A shown in FIG. 3B, the element isolation film 13 is embedded in the groove 2c extending into the semiconductor substrate 2, and a height of the upper surface of the element isolation film 13 is formed so as to substantially coincide with a height of the upper surface of the element isolation film 13 extending under, i.e., between the semiconductor substrate and the select gate lines SGLS in the memory cell area M. The interelectrode insulation film 25, the second electrode film 26, the third electrode film 32, the barrier metal film 27, and the metal film 28 are located in this order on the upper surface of the element isolation film 13. The insulation film 29 and the insulation film 30 are located in this order on the metal film 28.

In this cross section as well, the upper surface of the second electrode film 26 of the gate electrode PG1 is formed to have substantially the same height as the height of the upper surface of the second electrode film 6 of the word line WL and the selecting gate line SGLS. In this cross section as well, the third electrode film 32 of the gate electrode PG1 is located on the upper surface of the second electrode film 26. Herein, the "height" is a height of the upper surface of the film layer from the upper surface of the gate insulation films 3 and 23.

That is, in the cross section taken along lines 3Aa-3Aa and 3Ab-3Ab of FIG. 2A and shown in FIG. 3A, the upper surface of the second electrode film 26 of the gate electrode PG1 is configured to have substantially the same height as the height of the upper surface of the second electrode film 6 of the gate electrodes MG and the selecting gate electrodes SGS. That is, it may be said that a distance from the upper surface of the gate insulation film 3 to the upper surface of the second electrode film 6 is equal to a distance from the upper surface of the gate insulation film 23 to the upper surface of the second electrode film 26. The third electrode film 32 of the gate electrode PG1 is formed on the upper surface of the second electrode film 26. Accordingly, the uppermost surface of the gate electrodes MG may be lower by the film thickness dl of the third electrode film 32 formed on the upper surface of the second electrode film 26, as compared to the uppermost surface of the gate electrode PG1. Although the extent to which the various gate electrodes MG, SGS, PG1 and PG2 extend from the gate insulating films, or the extent to which a film layer extends from the gate insulating films or from an underlying film layer is discussed in terms of "height", the different heights also reflect the different thicknesses of the various gate electrodes MG, SGS, PG1 and PG2 and the thickness of film layers with respect to other film layers.

Accordingly, gate electrodes MG having a small height suitable for the memory cell MT to form a memory element may be configured. If the width between the memory cells MT in the Y direction is small and the height of the gate electrodes MG of the memory cell MT is great, the gate electrodes MG may collapse during the forming of the gate electrode MG. Likewise, if the space (gap G) between adjacent memory cells MT in the Y direction is narrow and the height of the gate electrode MG of the memory cell MT is large, it may be difficult to form the source and drain areas 2a in the semiconductor substrate 2 using the gate electrodes 2a to self align these source and drain areas to the gate electrodes MG for ion implanting of dopants into the source and drain areas. Meanwhile, since the gate length and the gate width of the gate electrode PG are large, and the spacing between these gate electrodes PG and surrounding structures are larger than that between the memory cell gates MG, these issues are unlikely to arise during the forming of the gate electrodes PG1 and PG2.

In addition, the diffusion depth of the dopants, and thus the depth of the source and drain areas 2d of the transistor Trp1, are often greater than the source and drain regions of the memory cell transistors MT. To form these deeper source and drain areas 2d the ion implant acceleration energy of ions which form the source and drain areas 2d is increased. With the thicker gate electrode PG1, the likelihood of the implanted ions penetrating through the gate electrode PG1 when the gate electrode PG1 is used to self align the source and drain areas 2d thereto, and thus reaching the channel area of the surface layer of the semiconductor substrate 2 beneath the gate electrode PG1, is reduced. If the dopant ions used to form the doped source and drain regions, they can shorten the channel length, or cause the channel to short between the source and drain. In either case, the threshold voltage of the transistor will be changed.

In addition, since the width of the gate electrode PG1 is wider than the width of the gate electrode MG, the width of the opening 31 in the gate electrode PG1 may be wider than, or the number of the openings 31 may be greater than, the openings 11 in the memory cell gates MG, and a gate electrode PG1 having low wiring resistance and interface resistance may be configured.

Next, the structure of the transistor Trp2 will be described with reference to the cross sections taken along line 3Ac-3Ac of FIG. 2C as shown in FIG. 3A and line 3Bc-3Bc of FIG. 2C as shown in FIG. 3B. As illustrated with the transistor Trp2 in FIG. 3A and FIG. 3B, in the peripheral circuit area P, the gate electrode PG2 of the transistor Trp2 may be formed to have substantially the same height as the height of the gate electrodes MG of the memory cell MT and/or the gate electrodes SGS of the selecting transistor STS. Herein, the "height" is the height from the upper surfaces of the gate insulation films 3 and 43 to the uppermost surface of the gate electrode PG2, i.e., the thickness of the gate electrode PG2.

The transistor Trp2 includes a gate electrode PG2 which is formed on a gate insulation film 43 formed on the semiconductor substrate 2, and source and drain areas 2e formed in the surface layer of the semiconductor substrate 2 on both sides of the gate electrode PG2. Herein, a depth of the source and drain areas 2e may be smaller than the depth of the source and drain areas 2d of transistors Trp1. In addition, the depth of the source and drain areas 2e may be set to be equal to or smaller than the depth of the source and drain areas 2a of the memory cell transistors MT.

The gate electrode PG2 has substantially the same configuration as the gate electrode SGS of the select transistor STS. In the transistor Trp2, a gate insulation film 43 is formed on the element area Saa. This gate insulation film 43 is formed of silicon oxide, for example, and may be formed to have a different thickness than gate insulating films 3 and 23 in accordance with the requirements of the transistor Trp2. The gate electrode PG2 is formed on the gate insulation film 43.

For the gate electrode PG2, a first electrode film 44, an interelectrode insulation film 45, a second electrode film 46, a barrier metal film 47, and a metal film 48 are formed in that order on the gate insulation film 43. An insulation film 49 and an insulation film 50 are formed in this order on the metal film 48. The first electrode film 44 is configured as a polysilicon film into which an n-type dopant (for example, phosphorus (P)) is introduced, for example. The embodiment in which the n-type dopant is introduced into the first electrode film 44 is illustrated, but a p-type dopant may be introduced therein.

The interelectrode insulation film 45 is configured with the same material as that of the interelectrode insulation films 5 and 25. The second electrode film 46 is configured as a polysilicon film into which an n-type dopant is introduced, for example. The embodiment in which the n-type dopant is introduced to the second electrode film 46 is illustrated, but a p-type dopant may be introduced therein.

The barrier metal film 47 is configured with the same material (for example, tungsten nitride (WN)) as that of the barrier metal films 7 and 27. The metal film 48 is configured with the same material (for example, tungsten (W)) as that of the metal films 8 and 28. The insulation film 49 is configured with the same material (for example, silicon nitride film) as that of the insulation films 9 and 29. The insulation film 50 is configured with the same material (for example, silicon oxide film) as that of the insulation films 10 and 30.

In the gate electrode PG2, one or a plurality of openings 51 are provided through the inter-electrode insulation film 45 and the second electrode film 46, and a third electrode film 52 is embedded in the opening 51. The third electrode film 52 is configured as a polysilicon film to which an n-type dopant (for example, phosphorus (P)) is introduced, for example. The embodiment in which the n-type dopant is introduced to the third electrode film 52 is illustrated, but a p-type dopant may be introduced thereto.

The third electrode film 52 is an electrode film which electrically connects the first electrode film 44 and the barrier metal film 47 through the openings 51, and accordingly, the first electrode film 44 and the metal film 48 are electrically connected to each other in the gate electrode PG2, and thus the gate electrode PG2 becomes an integral gate electrode. The upper surface of the third electrode film 52 and the upper surface of the second electrode film 46 substantially coincide with each other and are formed to be flat. Thus, in the gate electrode PG2, the third electrode film 52 is not formed on the upper surface of the second electrode film 46.

A gate width of the peripheral transistor Trp2 may be wider than the gate width of the selecting transistor STS. As a result, a width of the opening 51 of the peripheral transistor Trp2 is wider, or the number of the openings is increased, as compared to the openings 11 of the select gates SGS depending on the gate width, and therefore it is possible to decrease contact resistance between the first and third electrode films 44 and 52.

In the cross section taken along line 3Bc-3Bc of FIG. 2C shown in FIG. 3B, the element isolation film 13 is embedded in the groove 2c of the semiconductor substrate 2, and a height of the upper surface of the element isolation film 13 may be formed so as to substantially coincide with a height of the upper surface of the element isolation film 13 below the selecting gate line SGLS in the memory cell area M and the upper surface of the element isolation film 13 below the gate electrode PG1 of the peripheral circuit area P. The interelectrode insulation film 45, the second electrode film 46, the barrier metal film 47, and the metal film 48 are located in that order on the upper surface of the element isolation film 13. The insulation film 49 and the insulation film 50 are located in this order on the metal film 48.

In this cross section, the opening 51 is not formed on the second electrode film 46 and the interelectrode insulation film 45, and the interelectrode insulation film 45, the second electrode film 46, the barrier metal film 47, and the metal film 48 are stacked one over the other without the third electrode film of the stack located on the upper surface of the element isolation film 13. In this cross section, the upper surface of the second electrode film 46 of the gate electrode PG2 is formed to have substantially the same height as the height of the upper surface of the second electrode film 6 of the word line WL and the select gate line SGLS.

In the cross section taken along lines 3Aa-3Aa of FIGS. 2A and 3Ac-3Ac of FIG. 2C as shown in FIG. 3A, the upper surface of the second electrode film 46 of the gate electrode PG2 is configured to have substantially the same height as the height of the upper surface of the second electrode film 6 of the gate electrode MG and the selecting gate electrode SGS, i.e., second electrode film 46 and 6 have the same thickness. This is because the third electrode film 52 of the gate electrode PG2 is not formed on the upper surface of the second electrode film 46.

According to the exemplary embodiment, the memory cell MT and the transistor Trp1 are formed on the semiconductor substrate 2, the gate electrode MG of the memory cell MT is formed with the metal film 8, the barrier metal film 7, and the second electrode film 6 located in this order from the top thereof, and the gate electrode PG1 of the transistor Trp1 is formed with the metal film 28, the barrier metal film 27, the third electrode film 32, and the second electrode film 26 located in this order from the top. That is, the configurations of the gate materials of these gates are different from each other. Thus, the height (thickness) of the gate electrode MG and the selecting gate electrode SGS may be configured to be lower than the height (thickness) of the gate electrode PG1.

In addition, it is possible to form the transistors Trp1 and Trp2 to have different heights (thicknesses) in the peripheral circuit area P. The height of the gate electrode PG2 may be smaller than the height of the gate electrode PG1. For example, the height of the gate electrode PG2 may be substantially equivalent to that of the gate electrode MT. For example, by disposing the gate electrodes PG2 close to the gate electrode MG, it is possible to increase precision of the thicknesses of the film layers of these electrodes in a CMP step which will be described later herein.

Hereinafter, a manufacturing method of the structure described above will be described with reference to FIG. 4A to FIG. 14B. The embodiment will be described in terms of major processes and steps for the formation thereof, however, other steps may be added between each step if it is a typical step, for example a cleaning step, a resist stripping step, etc., and steps described below may be eliminated as needed. In addition, the order of the steps may be appropriately switched so long as that may be practically performed. FIGS. 4A, 5A, 6A, 7A, 8A, 9A, 10A, 11A, 12A, 13A, and 14A are examples of a longitudinal cross-sectional side view taken along line 3Aa-3Aa of FIG. 2A, line 3Ab-3Ab of FIG. 2B, and line 3Ac-3Ac of FIG. 2C and schematically illustrating one manufacturing stage. FIGS. 4B, 5B, 6B, 7B, 8B, 9B, 10B, 11B, 12B, 13B, and 14B are examples of a longitudinal cross-sectional side view taken along line 3Ba-3Ba of FIG. 2A, line 3Bb-3Bb of FIG. 2B, and line 3Bc-3Bc of FIG. 2C and schematically illustrating one manufacturing stage in a first embodiment.

For convenience of the description, the following description will be performed with reference to the reference numerals in the above-described structure, but the reference numerals 3 to 12 used in the drawing (cross section taken along line 3Aa-3Aa) illustrating the manufacturing stage of the memory cell MT and the selecting transistor STS in the memory cell area M, and the reference numerals 23 to 32, and 43 to 52 used in the drawings (cross sections taken along line 3Ab-3Ab and line 3Ac-3Ac) illustrating the peripheral circuit area P are different by the number of "20" and "40", and the corresponding reference numerals denote elements which are formed as films by substantially the same step or substantially the same stage.

First, as illustrated in FIG. 4A and FIG. 4B, the gate insulation films 3, 23, and 43 are formed on the semiconductor substrate (p-type monocrystalline silicon substrate) 2. As the gate insulation films 3, 23, and 43, silicon oxide films are formed by a thermal oxidation process, for example. The thermal oxidation process is performed separately, i.e., the surface of the semiconductor substrate 2 is oxidized for different periods of time, and/or at different temperatures, and/or at a different oxygen concentration ambient, such that the resulting gate insulation films 3, 23, and 43 grown by thermal oxidation may have different film thicknesses from each other.

Next, polysilicon for forming the floating electrode FG is deposited on the gate insulation films 3, 23 and 43 by an LPCVD method, for example, and accordingly, the first electrode films 4, 24, and are formed. A p-type dopant (for example, boron (B)) is introduced to the first electrode film 4 and an n-type dopant (for example, phosphorus (P)) is introduced to the first electrode films 24 and 44.

As a formation method for the first electrode films 4, 24 and 44, after depositing undoped polysilicon, a patterned resist mask (not illustrated) having an opening or openings over the polysilicon used to form the first electrode film 4 is formed using a photolithography method, the dopant is implanted by the ion implantation method, and accordingly the p-type dopant (for example, boron (B)) is implanted into the first electrode film 4. After removing the patterned resist mask and then forming another patterned mask having an opening or openings over the polysilicon used to form the first electrode films 24, 44, the n-type dopant (for example, phosphorus (P)) is implanted into the first electrode films 24 and 44.

In addition, as another method, p-doped polysilicon to form the first electrode film 4 is deposited onto the gate insulation film 3, for example, and the portion of the p-doped polysilicon deposited other than in the memory cell area M is removed. Then, n-doped polysilicon is deposited to form the first electrode films 24 and 44 by the same method, and the n-doped polysilicon in the memory cell area M is removed. With this method as well, the p-type dopant (for example, boron (B)) may be introduced to the first electrode film 4 and the n-type dopant (for example, phosphorus (P)) may be introduced to the first electrode films 24 and 44. Next, a silicon nitride film 100, to be used as a hardmask for patterning the first electrode films 4, 24, and 44 is formed by a CVD method. The embodiment describes the first electrode film 4 as p-type polysilicon and the first electrode films 24 and 44 as n-type polysilicon, but this may be reversed.

Next, a patterned resist mask is formed on the silicon nitride film 100 by a photolithography method, and the silicon nitride film 100 is patterned by a reactive ion etching (RIE) method which is a dry etching technology using this resist mask as a mask. The resist mask is removed by asking.

Next, using the patterned silicon nitride film 100 as a mask, the first electrode films 4, 24, and 44, the gate insulation films 3, 23, and 43, and the upper portion of the semiconductor substrate 2 are subjected to a dry etching process by the RIE method, and as illustrated in FIG. 4B, to form the groove 2c into the semiconductor substrate 2 to form, and separate, the element isolation areas Sb and Sbb.

Figure 5A:
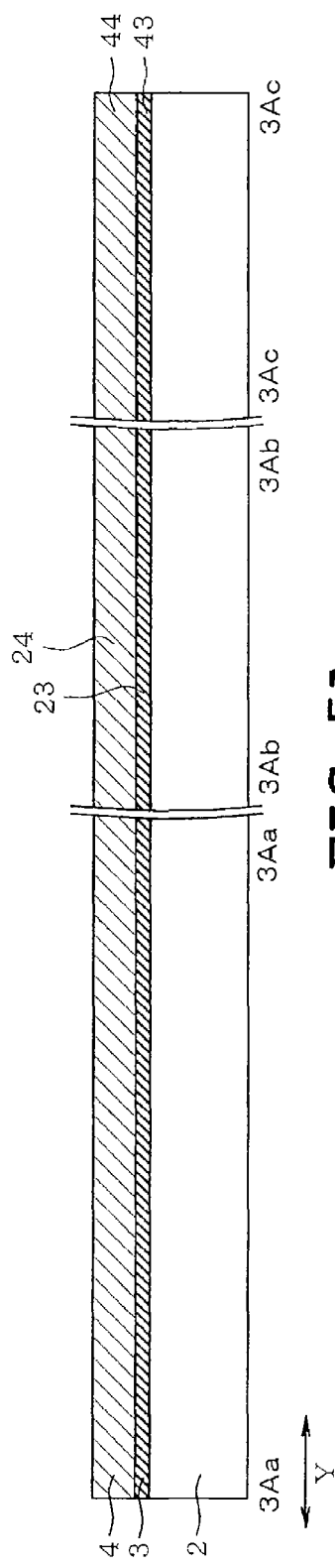
Figure 5B:
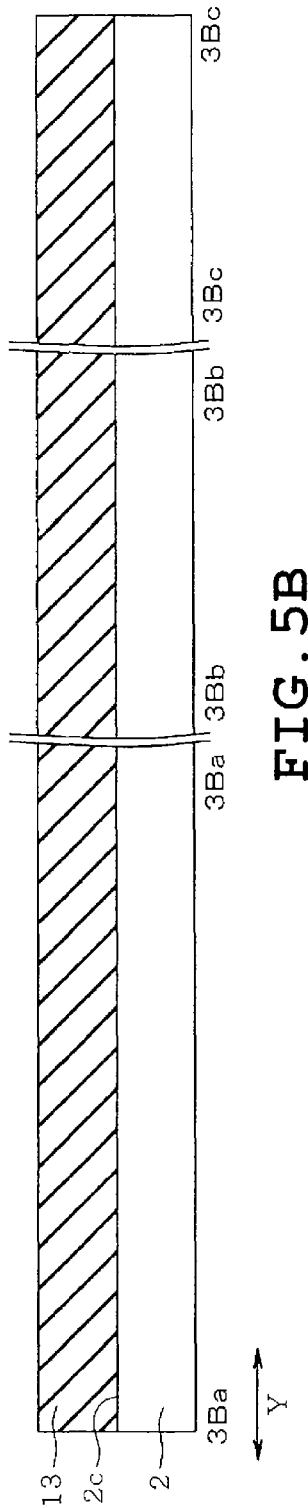

Next, as illustrated in FIG. 5A and FIG. 5B, the element isolation film 13 is formed in the groove 2c. This element isolation film 13 is a silicon oxide film which is formed by spin coating of polysilazane to form a spin on glass (SOG) layer, for example. An etching rate of the silicon oxide film formed using polysilazane in hydrofluoric acid (HF) is approximately 100 times the etching rate of the thermal silicon oxide film in hydrofluoric acid (HF).

After forming the element isolation film 13 in the groove 2c and over the first electrode films 4, 24 and 44, planarization of the element isolation film 13 in the groove, and removal of portions thereof overlying the first electrode films 4, 24 and 44 is performed by a chemical mechanical polishing (CMP) method, for example, or an etching-back process is performed using the RIE method, for example, and accordingly, the element isolation film 13 is formed so that a position of the upper surface thereof is lower than the upper surfaces of the first electrode films 4, 24, and 44 and higher than the upper surfaces of the gate insulation films 3, 23, and 43. The silicon nitride film 100 is removed by a hot phosphoric acid process, for example.

Figure 6A:
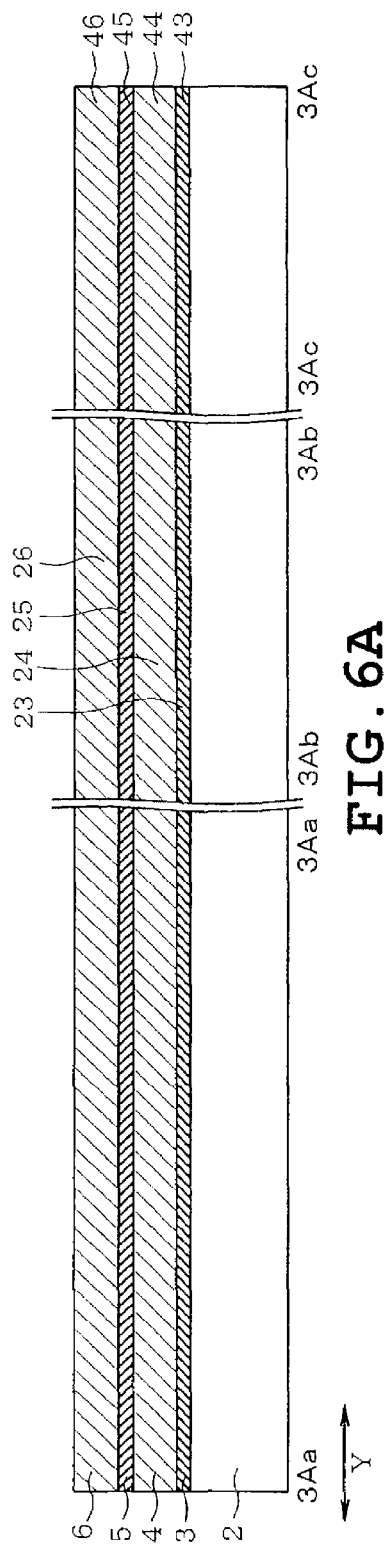
Figure 6B:
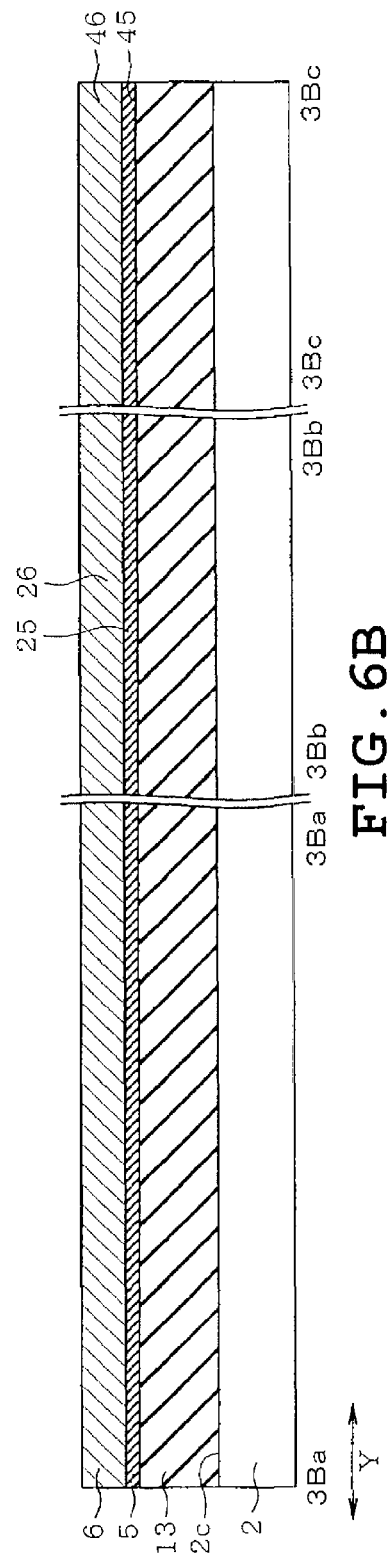

As illustrated in FIG. 6A and FIG. 6B, the interelectrode insulation films 5, 25, and 45 are formed on all of the surfaces (that is, on the first electrode films 4, 24, and 44 of FIG. 6A and on the element isolation film 13 of FIG. 6B). The interelectrode insulation films 5, 25, and 45 may be formed simultaneously employing an ONO film or a NONON film, for example. The films are formed using the LPCVD (low pressure chemical vapor deposition) method, as the formation method, for example.

The second electrode films 6, 26, and 46 are formed on the interelectrode insulation films 5, 25, and 45. At that time, a p-type dopant (for example, boron (B)) is introduced to the second electrode film 6 and an n-type dopant (for example, phosphorus (P)) is introduced to the second electrode films 26 and 46.

As the formation method, after temporarily depositing un-doped polysilicon, a patterned resist mask (not illustrated) is formed using a lithography method, the p-dopant is implanted through an opening or openings in the patterned resist in regions overlying the second electrode film 6 by the ion implantation method, and accordingly the p-type dopant (for example, boron (B)) is implanted into the second electrode film 6. After removing the resist mask and then forming a new resist mask having an opening or openings overlying the second electrode films 36 and 46, an n-type dopant (for example, phosphorus (P)) is introduced to the second electrode films 26 and 46. This method is used as the formation method.

In addition, as another method, after depositing p-doped polysilicon to form the second electrode film 6 onto the interelectrode insulation films 5, 25, and 45, the second electrode film 6 not in the memory cell area M is removed. Then, an n-doped polysilicon film to form the second electrode films 26 and 46 is deposited by the same method, and the n-doped polysilicon film in the memory cell area M is removed. With this method as well, the p-type dopant (for example, boron (B)) may be introduced to the second electrode film 6 and the n-type dopant (for example, phosphorus (P)) may be introduced to the second electrode films 26 and 46.

Next, as illustrated in FIG. 7A and FIG. 7B, a patterned mask (not illustrated) for forming openings in an area (for example, center portion) of the gate electrodes SGD and SGS of the select transistors STD and STS, and an area (for example, center portion or both side portions separated to the sides from the center) of the gate electrodes PG1 and PG2 of the transistors Trp1 and Trp2 is formed over the second electrode films 6, 26 and 46, and an anisotropic etching process is performed using this mask pattern as a mask, and accordingly, portions of the second electrode films 6, 26, and 46 and the interelectrode insulation films 5, 25, and 45 are selectively removed (particularly see FIG. 7A). At this time, in the cross section illustrated in FIG. 7A, portions of the second electrode films 6, 26, and 46 and the interelectrode insulation films 5, 25, and 45 are removed so as to form openings reaching the first electrode film 4. In the cross section illustrated in FIG. 7B, only the second electrode film 6 and the inter-electrode insulation film 5 are removed to the upper surface of the element isolation film 13, i.e., openings 11 are formed only in the memory cell region. Accordingly, the openings 11 may be formed in portions of the second electrode film 6 and the interelectrode insulation film 5, and the openings 31 and 51 are formed in portions of the second electrode film 26 and 46, and the interelectrode isolation films 25 and 45.

Figure 8A:
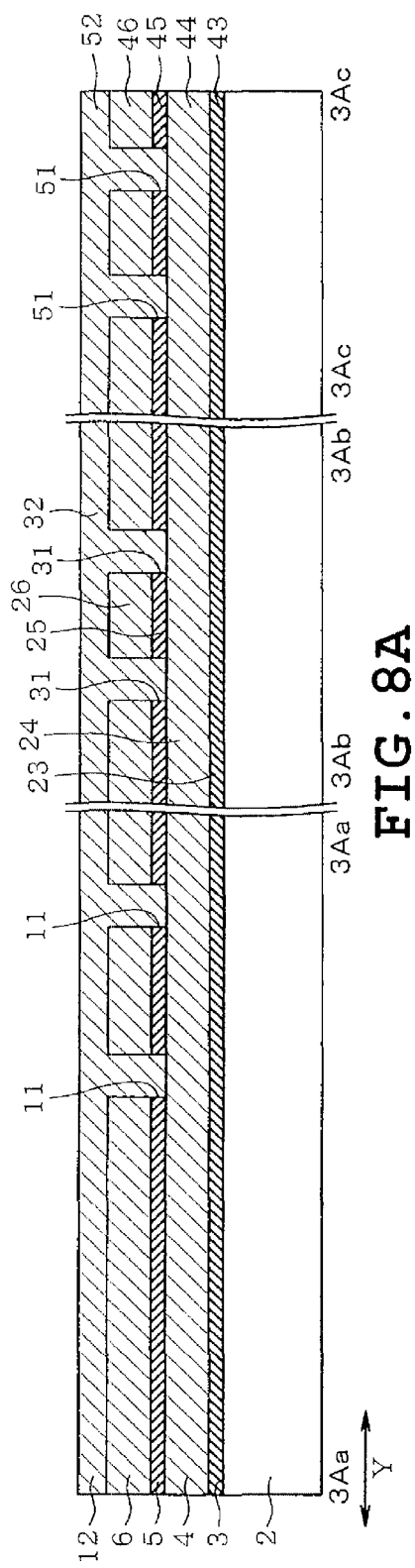
Figure 8B:
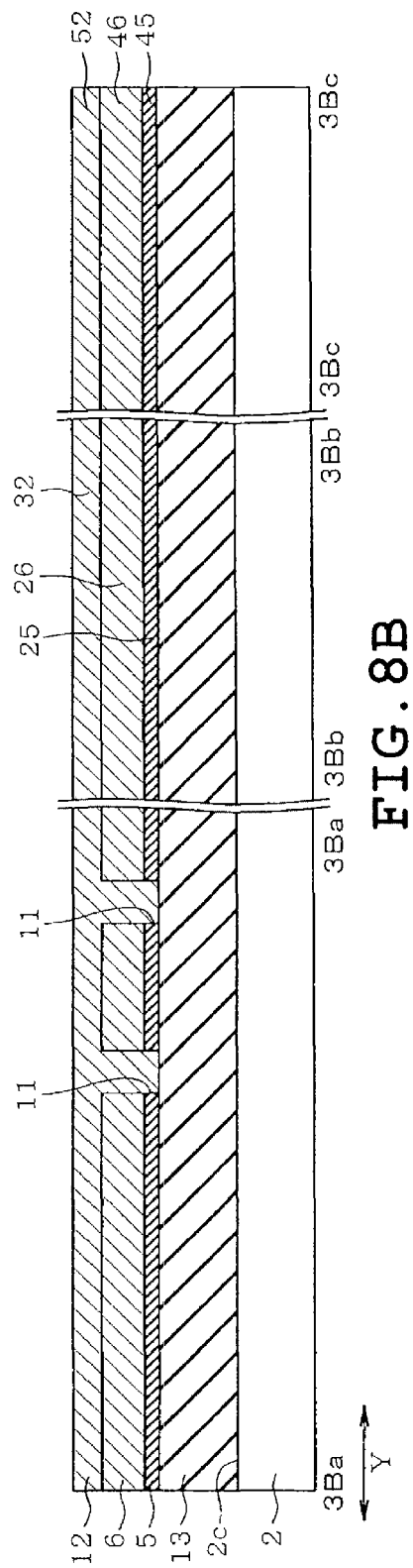

As illustrated in FIG. 8A and FIG. 8B, the third electrode films 12, 32, and 52 are formed. The third electrode film 12 is formed of a p-type polysilicon, for example, and the third electrode films 32 and 52 are formed of an n-type polysilicon, for example. In this formation method, an undoped polysilicon film, for example, is formed on all of the surfaces of the second electrode film 6, 26 and 46 by the CVD (chemical vapor deposition) method, a patterned resist mask (not illustrated) is formed by the photolithography lithography method, and dopants are implanted by the ion implantation method. A p-type dopant (for example, boron (B)) is implanted through an opening or openings in the patterned resist mask overlying the third electrode film 12 into the third electrode film 12. After removing this resist mask and then forming a new patterned resist mask having openings overlying third electrode films 32 and 52, an n-type dopant (for example, phosphorus (P)) is implanted into the third electrode films 32 and 52. Next, as illustrated in FIG. 9A and FIG. 9B, after a resist mask (not illustrated) is selectively formed to overlie the formation area of the gate electrodes PG1 of the transistors Trp1 by the photolithography method, and the third electrode films 12 and 52 of the gate electrodes MG, and the select gate electrodes SGS in the memory cell area M and gate electrodes PG2 are subjected to dry etching using the RIE method, to etch the upper surfaces of the third electrode films 12 and 52 to be flush or substantially flush with the upper surface of the second electrode films 6 and 46 and thus embed the third electrode film 12 and 52 in the openings 11 and 51. By selecting the etching amount of the third electrode films 12 and 52, the height (thickness) of the gate electrode MG and the selecting electrode SGS of the nonvolatile memory cell MT extending above the gate insulating films 3 and 43 may be adjusted to be less than the height (thickness) of the gate electrode PG1.

During the polishing or RIE process, as illustrated in FIG. 9A and FIG. 9B, residual material of the third electrode films 12 and 52 on the upper surfaces of the second electrode films 6 and 46 are removed, and the upper surfaces of the second electrode films 6 and 46 are exposed. The height of the upper surfaces of the second electrode films 6 and 46 may be suitably adjusted by continued polishing or etching of the second and third electrode films, or some of the thickness of the third electrode films 12 and 52 may remain on the upper surfaces of the second electrode films 6 and 46. There is no limitation as long as the film thickness of the third electrode films 12 and 52 is smaller than the film thickness of the third electrode film 32 (see eighth embodiment). However, because the doped polysilicon film forming the gate electrodes PG1 of the transistors Trp1 is covered by the resist mask, the third electrode film 32 is not reduced in thickness.

Figure 10A:
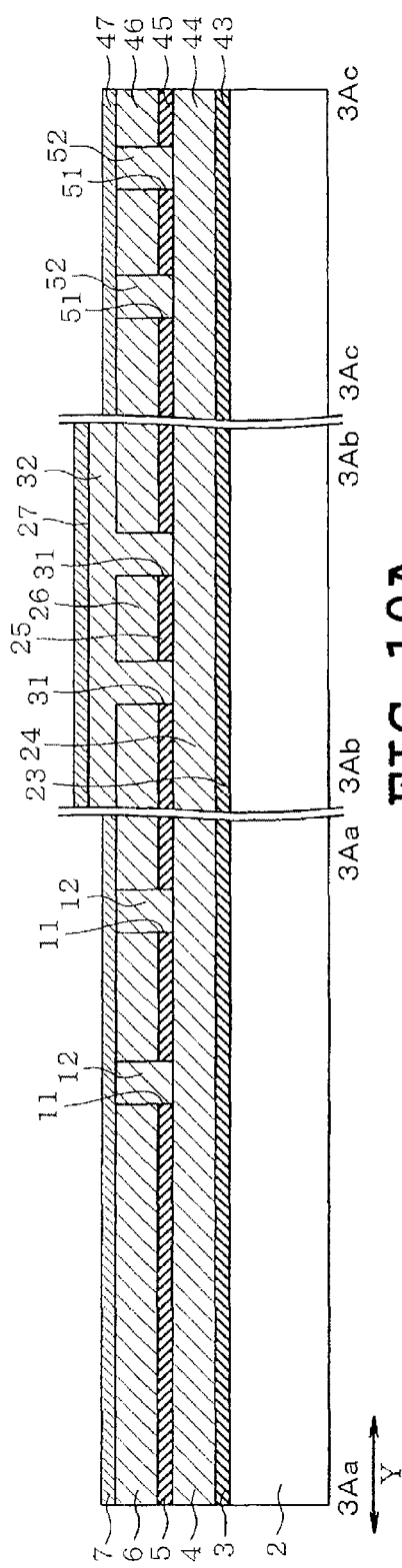
Figure 10B:
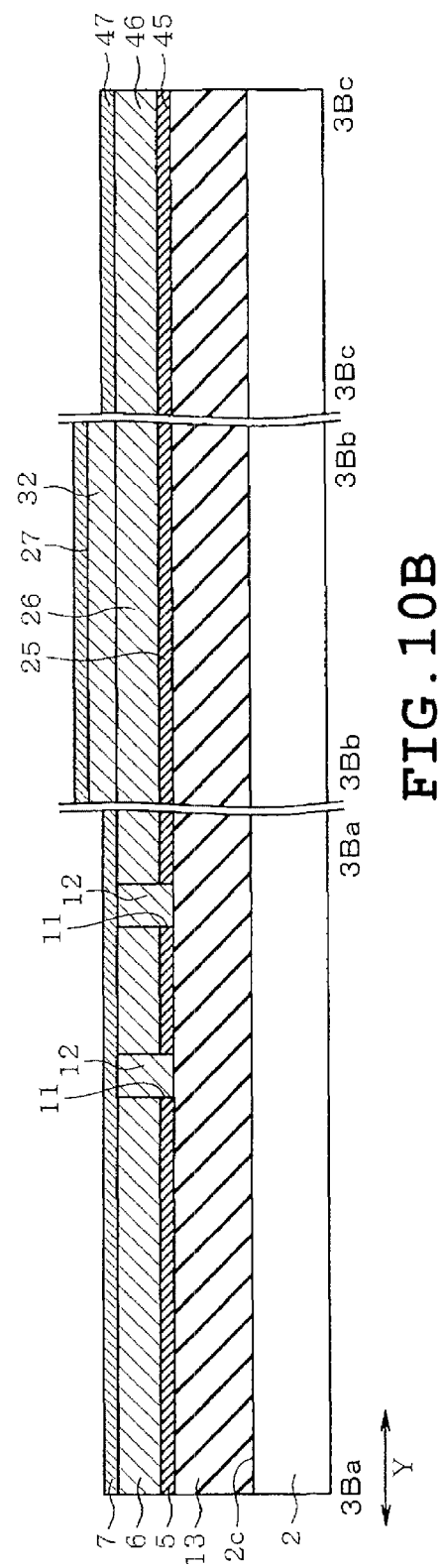

Next, as illustrated in FIG. 10A and FIG. 10B, the barrier metal films 7, 27, and 47 are formed on the exposed upper surfaces of the second electrode films 6 and 46 and the third electrode films 12, 32, and 52. As the barrier metal films 7, 27, and 47, tungsten nitride (WN) or titanium nitride (TiN), for example, may be used. The barrier metal films 7, 27, and 47 may be formed at the same time using a sputtering method. In FIG. 10A and FIG. 10B, the barrier metal films 7, 27, and 47 are seen to be separated, but are smoothly formed along the upper surfaces of the second electrode films 6, 26 and 46 and third electrode film 12, 32, 52 between the areas M and P.

As illustrated in FIG. 11A and FIG. 11B, the metal films 8, 28, and 48 are formed on the barrier metal films 7, 27, and 47. As the metal films 8, 28, and 48, tungsten (W) may be used, for example. At that time, the metal films 8, 28, and 48 may be formed at the same time using the sputtering method, for example.

As illustrated in FIG. 12A and FIG. 12B, the insulation films 9, 29, and 49 are formed on the upper surfaces of the metal films 8, 28, and 48. The insulation films 9, 29, and 49 are films used in the forming process of the gate electrodes MG, SGS, PG1, and PG2, and are formed to function as hard masks using a silicon nitride film, for example.

As illustrated in FIG. 13A and FIG. 13B, a patterned resist mask (not illustrated) is formed on the upper surfaces of the insulation films 9, 29, and 49 by the photolithography method, and an anisotropic etching process such as RIE is performed on the portions of the insulation films 9, 29, and 49 underlying the openings in the resist mask, and a hard mask configured from the insulation films 9, 29, and 49 is patterned.

Then, as illustrated in FIG. 13A and FIG. 13B, the mask pattern is etched through the underlying film stack that the gate electrode SGS of the select transistor STS and the gate electrodes PG1 and PG2 of the transistors Trp1 and Trp2 of the peripheral circuit are not singulated from the film stack, but the gate electrodes MG of the memory cell MT are individually formed, i.e., singulated from the film stack.

To form the individual gate electrodes MG, the metal film 8, the barrier metal film 7, the second electrode film 6, the inter-electrode insulation film 5 and the first electrode film 4 and gate insulator film 3 are subjected to the anisotropic etching process using the RIE method, with the patterned insulation film 9 as a mask, and the gate electrodes MG of the memory cells MT are formed.

Figure 14A:
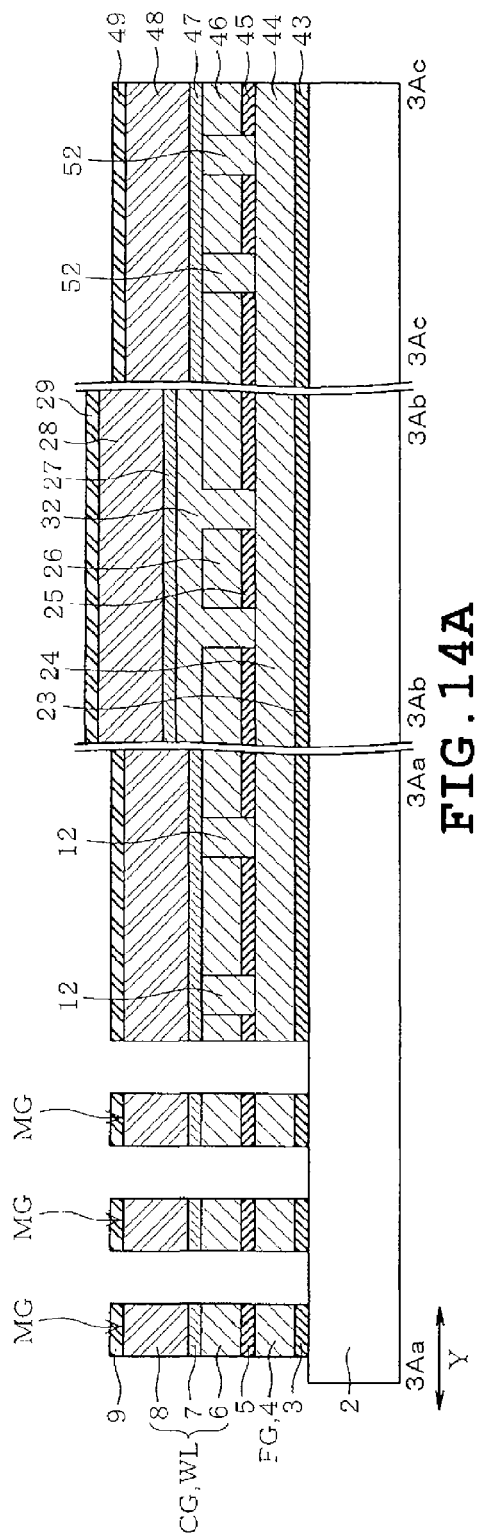
Figure 14B:
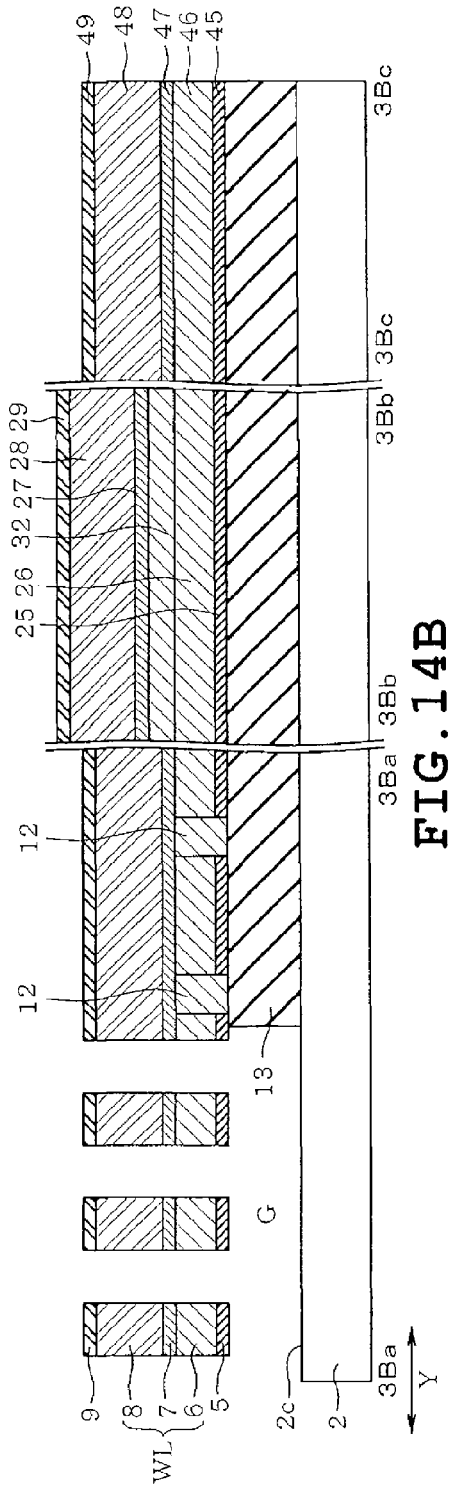

As illustrated in FIG. 14A and FIG. 14B, after forming the gate electrodes MG, the element isolation film 13 is selectively subjected to the etching process so that the element isolation film 13 directly below the select gate electrode SGS remains, but the element isolation film 13 beneath the memory gates MG is removed. This process may be performed with an isotropic etch process, such as using a dilute hydrofluoric acid, which selectively etches the silicon oxide file as compared to the surrounding silicon of the semiconductor substrate and silicon nitride of the gate insulation film, because the silicon oxide of the element isolation film 13 was formed from polysilazane which has a very high etch rate in HF. Accordingly, the element isolation film 13 may be subjected to the etching process in a highly selective manner, as compared to the gate insulation film 3, for example.

Because the only access of the hydrofluoric acid to the silicon oxide of the element isolation film 13 is through the gaps etched between the memory cell gates MG, by controlling the etching processing time, it is possible to cause the element isolation film 13 directly below the selecting gate line SGLS to remain in place when that between the word lines WL and the surface of the semiconductor substrate 2 in the trench 2 is removed. Accordingly, the gap G (FIG. 14B) is provided only where the element isolation film 13 is removed directly below the word line WL.

When etching the element isolation film 13, it is desirable to form the gap G which penetrates at least into the element isolation film 13 located directly below the gate electrodes MG of the memory cells MT. This gap G greatly reduces capacitance between the element areas Sa and between the wirings and the substrate.

Dopants are implanted by the ion implantation method using the memory cell MG as a mask (ion implantation step A) to form the doped regions 2a, 2b, 2d and 2e illustrated in FIG. 3A and FIG. 3B. The dopants are implanted into doped areas 2b and 2d by the ion implantation method using the select gate electrodes SGS as a self aligning mask. In a separate step from ion implantation step A, the dopant is implanted by the ion implantation method using the gate electrodes PG1 in the peripheral circuit area P as an in situ mask (ion implantation step B). Herein, when performing ion implantation step B, a mask is formed by the resist in the vicinity of the gate electrode PG2 in the area M and the area P. In addition, in the separate step from the ion implantation step B, dopants are implanted by the ion implantation method using the gate electrode PG2 in the peripheral circuit area P as a mask (ion implantation step C). The ion acceleration when performing the ion implantation step B is greater than the acceleration when performing the ion implantation step A, and hence the depth into the substrate 2 to which the dopant extends is deeper as a result of ion implantation step B compared to that of ion implantation step A. In addition, the acceleration when performing the ion implantation B is greater than the acceleration when performing the ion implantation C and hence the depth into the substrate 2 in which the dopant extends is deeper as a result of ion implantation step B compared to that of ion implantation step C.

Thereafter, the insulation films 10, 30, and 50 are formed on the gate electrode MG and on the select gate electrode SGS, and on gate electrodes PG1 and PG2, respectively so as to generate the gap G. At that time, the insulation films 10, 30, and 50 may be formed at the same time with a silicon oxide film such as a plasma TEOS film or plasma SiH$_4$ by a plasma CVD method by which a step coverage is poor.

In order to increase the degree of integration (packing together) of the memory cell units UC), the gaps between the gate electrodes MG of the memory cell MT and between the gate electrode SGS of the select transistor STS and the gate electrode MG of the memory cell MT are adjusted to be narrow. Accordingly, the insulation film 10 will barely extend into the gap G between the gate electrodes MG and SGS and between the gate electrodes MG and MG, and a covering is thus formed over the gaps G between the gate electrodes MG and SGS and between the gate electrodes MG and MG.

As a result, a gap G which is not filled with the insulating film 10 may be formed by the insulation film 10 forming a cap over the gaps G between the gate electrodes MG of the memory cell MT and between the gate electrode SGD of the selecting transistor STD and the gate electrode MG of the memory cell MT. When the gap G is formed, it is possible to reduce the wiring capacitance between the gate electrodes MG and the capacitance between the gate electrode MG and the semiconductor substrate 2. Accordingly, it is possible to suppress an unintended activation of a memory cell during reading, writing or erasing of an adjacent memory cell MT due to interference between the memory cells MT, and to suppress wiring based delays in reading, writing or erasing of the memory cells MT.

To form the select gates SGS and the gate electrodes PG1 and PG2, a resist mask (not illustrated) is formed on the insulation films 10, 30, and 50 by the lithography method, and patterned to form openings therein corresponding to sidewalls of the select gates SGS and the gate electrodes PG1 and PG2, and the underlying metal films 8, 28 and 48, the barrier metal films 7, 27 and 47, the second electrode films 6, 26 and 46, the inter-electrode insulation films, 25 and 45, the first electrode films 4, 24 and 44 and the gate insulator films 3, 23 and 43 are subjected to and anisotropic etching process using the RIE method. Thus, as is shown in FIGS. 15A and 15B, the select gate electrode SGS and the gate electrodes PG1 and PG2 are individually formed. In the cross sections illustrated in FIG. 3A and FIG. 3B, two select gate lines SGLS (selecting gate electrodes SGS) may be formed, and the gate electrodes PG1 and PG2 may be simultaneously formed in the peripheral circuit area P.

Using such a manufacturing method, the height of the gate electrode MG of the memory cell MT may be configured to be lower than the height of the gate electrode PG1. The respective heights at that time are heights of the gate electrodes MG and PG1 extending from the upper surface of the gate insulation film 3 formed on the semiconductor substrate 2. Since the height of the gate electrode PG1 of the transistor Trp1 is configured to be higher, the gate resistance may be reduced and the operation thereof may be rapidly performed. In contrast, since the height of the gate electrode MG of the memory cell MT may be set to be low, an aspect ratio (height divided by width) of the memory cell gate is reduced, and the processing may be easily performed even where the memory cells MT are highly integrated. Therefore, the yield ratio of good memory devices recovered from processing a plurality of individual large silicon substrates is improved.

When forming the source and drain areas 2d, the dopant is implanted using the gate electrode PG as a mask in a self-aligned manner. The height of the gate electrode PG1 necessary for the ion implantation process may be established independently of the heights of the gate electrodes MG of the memory cell MT. Thus, even when the acceleration energy for the ion implantation for forming the deeper source and drain areas 2d is increased, it is possible to reduce a concern with the implanted ion penetrating the gate electrode PG1 and entering a channel area of the surface layer of the semiconductor substrate 2.

By employing the manufacturing method, regarding a processing step of the gate electrode PG1 of the transistor Trp1 in the peripheral circuit area P, and a processing step of the gate electrode MG of the memory cell MT in the memory cell area M, many manufacturing steps may be performed in common across the different device types (memory cells MT, gate electrodes PG1 and PG2 and select gates SGS) and the height of the gate electrodes MG and PG1 may be independently set as desired for independent optimization of the forming or operation of each. Therefore, it is possible to set the height (thickness) of the gate electrode PG of the transistor Trp1 to be high, while setting the height (thickness) of the gate electrode MG of the memory cell MT to be low.

Second Embodiment

FIG. 15A and FIG. 15B illustrate the second embodiment. In the second embodiment, a silicide layer 7a is formed between the second electrode film 6 and the barrier metal film 7 of the gate electrode MG of the memory cell MT, a silicide layer 27a is formed between the third electrode film 32 and the barrier metal film 27 of the gate electrode PG1 of the peripheral transistor Trp1, and a silicide layer 47a is formed between the barrier metal film 47 and the second and third electrode films 46 and 52.

As illustrated in FIG. 15A and FIG. 15B, the silicide layer 7a is formed in the gate electrode MG of the memory cell MT. The silicide layer 7a is formed between the lower surface of the barrier metal film 7 and the upper surface of the second electrode film 6. The silicide layer 7a is formed of a tungsten silicide (WSi) film, for example.

The silicide layer 27a is formed on the gate electrode PG1 of the transistor Trp1. The silicide layer 27a is formed between the lower surface of the barrier metal film 27 and the upper surface of the third electrode film 32. The silicide layer 27a is also formed of a tungsten silicide (WSi) film, for example.

The silicide layer 47a is formed on the gate electrode PG2 of the transistor Trp2. The silicide layer 47a is formed between the lower surface of the barrier metal film 47 and the upper surfaces of the second and third electrode films 46 and 52. The silicide layer 47a is also formed of a tungsten silicide (WSi) film, for example. Film thicknesses in a thickness direction of the silicide layers 7a, 27a, and 47a are substantially the same. This may be achieved using the same manufacturing step. The other structures of the gate electrodes are the same as in the embodiment described above, and therefore the description thereof will be omitted.

The manufacturing method will be described. The manufacturing method up to the manufacturing stage of FIG. 9A and FIG. 9B is the same as the manufacturing method according to the first embodiment, and therefore the description will be omitted. In the manufacturing stage of FIG. 9A and FIG. 9B, metal, for example, tungsten, is deposited on the upper surfaces of the second electrode films 6, 26, and 46 and subjected to a rapid thermal anneal (RTA) process to form the silicide layers 7a, 27a, and 47a. Any unreacted metal is removed using a wet etch chemistry. The silicide layers 7a, 27a, and 47a are formed simultaneously to have a film thickness of 5 Å to 200 Å, for example. Since the silicide layers 7a, 27a, and 47a are formed simultaneously, the silicide layers have the same film thickness in the areas M and P.

After that, the barrier metal films 7, 27, and 47 are formed on the upper surfaces of the silicide layers 7a, 27a, and 47a, and the metal films 8, 28, and 48 are formed on the upper surfaces of the barrier metal films 7, 27, and 47. The manufacturing step after that is the same as in the embodiment described above.

According to the embodiment, the height of the gate electrode MG of the memory cell MT may be lower than the height of the gate electrode PG1. As a result, it is possible to obtain the same effects as in the first embodiment.

In addition, since the gate electrode MG, the select gate SGS and the gate electrodes PG1 and PG2 include the silicide layer 47, it is possible to reduce the resistance of the gate electrode MG and the gate electrodes PG1 and PG2.

Third Embodiment

FIG. 16A to FIG. 18B illustrate the third embodiment and a modification example thereof. In the third embodiment, the silicide layer 27a is formed only on the gate electrode PG1 of the transistor Trp1 in the peripheral circuit area P.

As illustrated in FIG. 16A and FIG. 16B, the silicide layer 27a is formed on the gate electrode PG1 of the transistor Trp1. The silicide layer 27a is formed between the lower surface of the barrier metal film 27 and the upper surface of the third electrode film 32. The silicide layer 27a is formed of a tungsten silicide (WSi) film, for example. Meanwhile, the silicide layers 7a and 47a are not provided on the gate electrode MG and the select gate electrode SGS of the memory cell MT, or the gate electrode PG2. That is, the second electrode film 6 directly comes into contact with the barrier metal film 7 in the gate electrode MG and the select gate electrode SGS, and the second electrode film 46 directly comes in contact with the barrier metal film 47 in the gate electrode PG2. Accordingly, the height of the gate electrode PG1 of the transistor Trp1 in a part of the peripheral circuit area P is formed to be higher by the film thickness of the silicide layer 27a. In contrast, the height of the gate electrode MG of the memory cell MT is formed to be lower by the film thickness of the silicide layer 27a.

The manufacturing method will be described. The manufacturing method up to the manufacturing stage of FIG. 8A and FIG. 8B is the same as the manufacturing method of the first embodiment, and therefore the description will be omitted, but in the manufacturing stage of FIG. 8A and FIG. 8B, the silicide layers 7a, 27a, and 47a are formed on the upper surfaces of the third electrode films 12, 32, and 52. As a result, the films are formed as illustrated in FIG. 17A and FIG. 17B. The silicide layers 7a, 27a, and 47a may be formed simultaneously to have a film thickness of 5 Å to 200 Å, for example. In this case, the silicide layers have the same film thickness in the areas M and P.

As illustrated in FIG. 18A and FIG. 18B, a resist mask (not illustrated) is formed in a formation area of the gate electrode PG1 of the transistor Trp1 by the photolithography method to form a patterned resist, and the RIE method is used to remove the silicide layer 27a and the portions of the third electrode film 12 and 52 overlying the second electrode film 6 and 46 using this patterned resist as a mask. After removing the silicide layer 27a overlying the second electrode films 6 and 46, by adjusting the additional etching amount of the second electrode films 6 and 12 and the third electrode films 46 and 52 embedded therein, the upper surfaces of the second and third electrode films 6 and 12, and 46 and 52 are set lower than the upper surface of the silicide layer 27a.

Thereafter, the barrier metal films 7, 27, and 47 are formed on the upper surfaces of the second electrode films 6 and 12 and the portions of the third electrode films 46 and 52 embedded therein, and on the silicide layer 27a. The metal films 8, 28, and 48 are formed on the upper surfaces of the barrier metal films 7, 27, and 47. The manufacturing steps after that is the same as in the embodiment described above. Since the manufacturing steps after that is the same as the manufacturing step in the embodiment described above, the description thereof will be omitted.

In the embodiment, as illustrated in FIG. 16A and FIG. 16B, the height of the gate electrodes MG and SGS may be set lower than the gate electrode PG1. The height of the other gate electrodes (for example, PG2) in the peripheral circuit area P may also be set lower than the gate electrode PG2. As a result, the same effects as in the first and second embodiments are obtained.

Modification Example

Figure 16C:
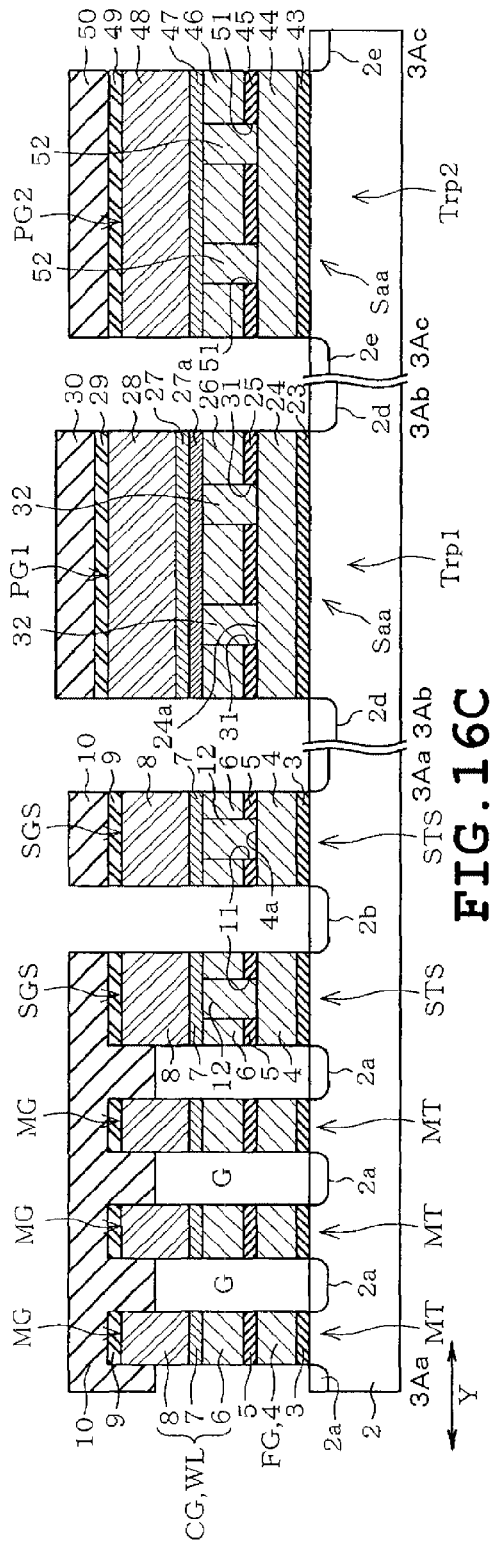
FIG. 16C is an example of a schematic longitudinal cross-sectional side view taken along line 3Aa-3Aa of FIG. 2A, line 3Ab-3Ab of FIG. 2B, and line 3Ac-3Ac of FIG. 2C according to a modification example of a third embodiment.
Figure 16D:
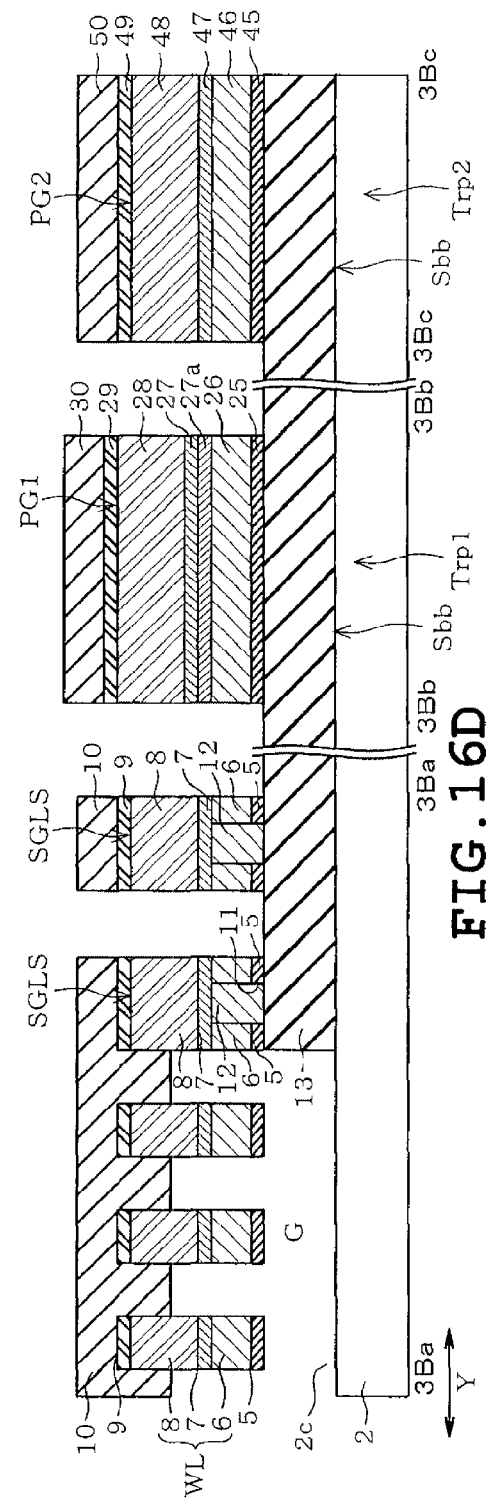
FIG. 16D is an example of a schematic longitudinal cross-sectional side view taken along line 3Ba-3Ba of FIG. 2A, line 3Bb-3Bb of FIG. 2B, and line 3Bc-3Bc of FIG. 2C in a modification example of the third embodiment.

As illustrated with a modification example in the FIG. 16C and FIG. 16D, the height from the top surface of the gate insulation films 3, 23, and 43 to the upper surfaces of the third electrode films 12, 32, and 52 are set to be same in the gate electrodes MG and SGS and the gate electrodes PG1 and PG2. Herein, the silicide layer 27a is formed only on the gate electrode PG1. Even with such a structure, the height of the gate electrodes MG and SGS may be lower than that of the gate electrode PG1. The height (thickness) of the other gate electrodes (for example, PG2) in the peripheral circuit area P may also be set lower than that of the gate electrode PG1. As a result, the same effects as in the first and second embodiments are obtained.

Regarding the manufacturing method, the gate electrodes MG, SGS, and PG2 are manufactured in the same manner as in the first embodiment, and the gate electrode PG1 may be manufactured by employing the manufacturing step of the gate electrode PG2 according to the second embodiment.

Fourth Embodiment

Figures 19A, 19B:
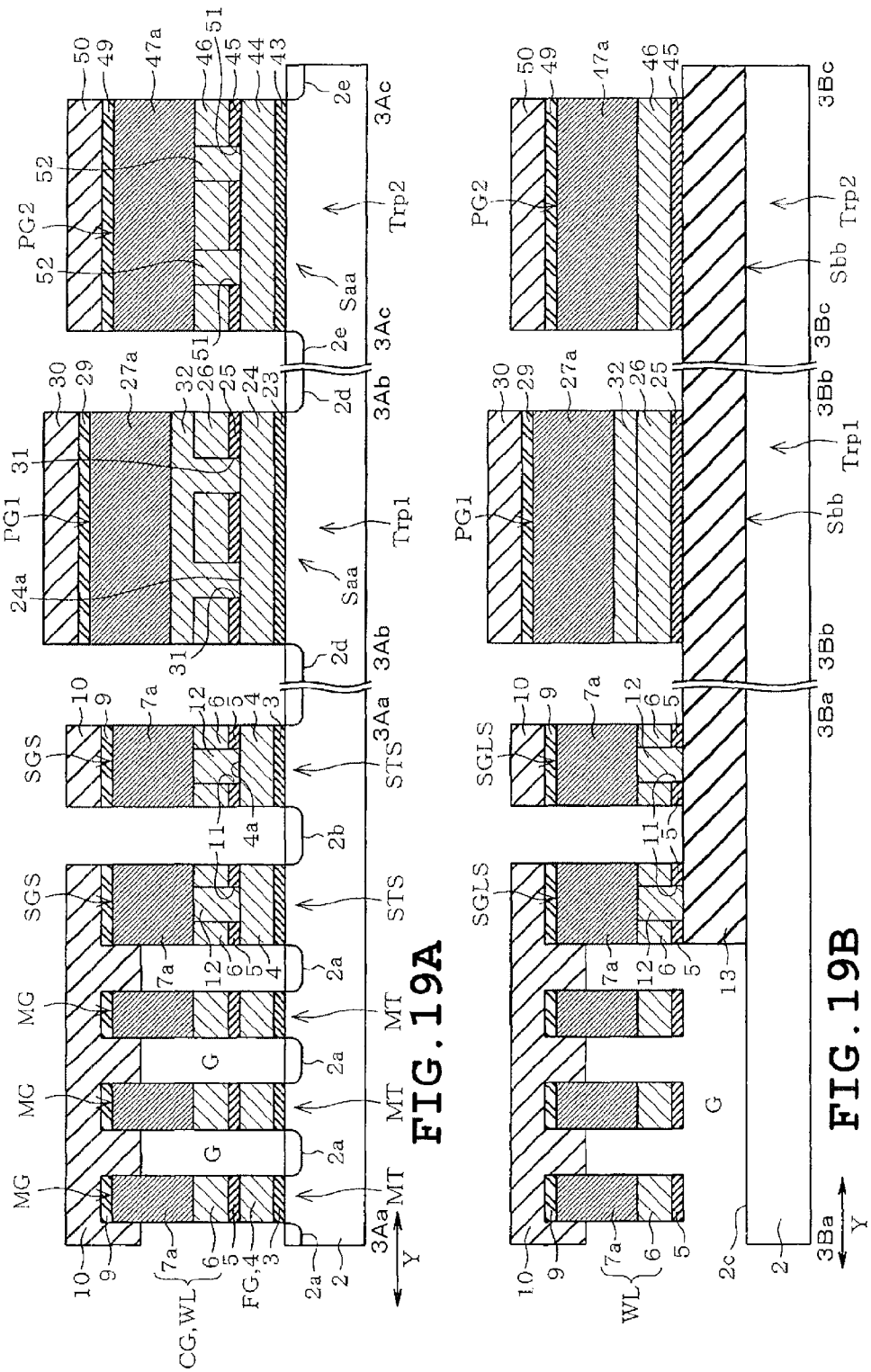
FIG. 19A is an example of a schematic longitudinal cross-sectional side view taken along line 3Aa-3Aa of FIG. 2A, line 3Ab-3Ab of FIG. 2B, and line 3Ac-3Ac of FIG. 2C according to a fourth embodiment.
FIG. 19B is an example of a schematic longitudinal cross-sectional side view taken along line 3Ba-3Ba of FIG. 2A, line 3Bb-3Bb of FIG. 2B, and line 3Bc-3Bc of FIG. 2C according to the fourth embodiment.

FIG. 19A and FIG. 19B illustrate the fourth embodiment. As illustrated in FIG. 19A and FIG. 19B, the electrode structure on the interelectrode insulation film 5 of the gate electrode MG of the memory cell MT is configured with a polysilicon film as the second electrode film 6, and the silicide layer 7a. In addition, the electrode structure of the third electrode film 32 of the gate electrode PG1 of the peripheral transistor Trp1 is configured with the silicide layer 27a. In addition, the silicide layer 47a is formed on the second electrode film 46 and the third electrode film 52 of the gate electrode PG2 of the peripheral transistor Trp2. The other structures are the same as in the embodiment described above, and therefore the description thereof will be omitted.

The manufacturing method will be described. The manufacturing method up to the manufacturing stage of FIG. 9A and FIG. 9B is the same as the manufacturing method of the first embodiment, and therefore the description will be omitted. In the manufacturing stage of FIG. 9A and FIG. 9B, the silicide layers 7a, 27a, and 47a are formed on the upper surfaces of the films 6, 12, 32, 46, and 52. The silicide layer 7a, 27a, and 47a may be formed at the same time to have a same film thickness of 5 Å to 200 Å, for example. In this case, the silicide layers have the same film thickness in the areas M and P. Thereafter, in the second embodiment, the barrier metal films 7, 27, and 47 are formed and the metal films 8, 28, and 48 are formed on the upper surfaces of the barrier metal films 7, 27, and 47, but in this fourth embodiment, these steps and the films formed thereby are omitted. That is, the insulation films 9, 29, and 49 are directly formed on the silicide layers 7a, 27a, and 47a. The manufacturing step after that is the same as in the embodiment described above.

With the structure of the embodiment, the height (thickness) of the gate electrode MG of the memory cell MT may be set lower than the height (thickness) of the gate electrode PG1.

Fifth Embodiment

FIG. 20 to FIG. 29 illustrate the fifth embodiment. In a bonded structure of a polysilicon and a metal (also including a barrier metal), if a Schottky junction is formed on the bonded surfaces thereof, an interface resistance is increased. In addition, a carrier dopant in the polysilicon is aggregated, and the interface resistance is increased, and a non-carrier dopant decreases an activation rate of the carrier dopant, and the resistance is increased.

Therefore, in the embodiment, the structure illustrated in FIG. 20 is used. FIG. 20 is an example of a schematic cross section taken along line 3Aa-3Aa of FIG. 2A and line 3Ab-3Ab of FIG. 2B as a fifth embodiment.

As illustrated in FIG. 20, the silicide layer 7a is provided on a contact interface between the upper portion of the third electrode film 12 and the barrier metal film 7 of the selecting gate electrode SGS. In addition, the silicide layer 27a is provided on a contact interface between the upper portion of the third electrode film 32 and the barrier metal film 27 of the gate electrode PG1 of the transistor Trp1. As a result, the silicide layers 7a and 27a are disposed on the interface between the polysilicon (third electrode films 12 and 32) and the metal (barrier metal films 7 and 27), and accordingly it is possible to reduce the interface resistance between the polysilicon and metal.

In the embodiment, as illustrated in FIG. 20, the silicide layer 7a is formed only on the upper portion of the third electrode film 12 which is embedded in the opening 11. In addition, the silicide layer 27a is formed only on the upper portion of the third electrode film 32 which is embedded in the opening 31. The silicide layers 7a and 27a are not formed on the upper portions of the second electrode films 6 and 26. That is to say, the silicide layers 7a and 27a are not exposed to the side surfaces of the gate electrodes MG and PG.

FIG. 21 to FIG. 29 schematically illustrate the manufacturing stages of the fifth embodiment with views taken along line 3Aa-3Aa of FIG. 2A and line 3Ab-3Ab of FIG. 2B. FIG. 21 illustrates the manufacturing stage illustrated in FIG. 6A of the embodiment described above, and in the embodiment, the films are formed using the same manufacturing steps as in the embodiment described above up to the manufacturing step.

Figure 22:
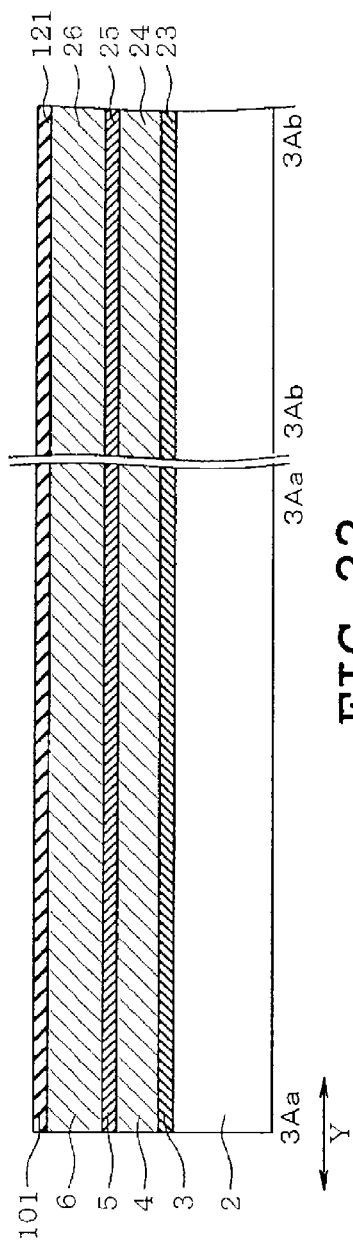

As illustrated in FIG. 22, the second electrode films 6 and 26 are formed, and etch stop films 101 and 121 forming an etch stop layer are formed on the upper surfaces of the second electrode films 6 and 26. The etch stop films 101 and 121 may be formed at the same time in the areas M and P by the CVD method using a silicon nitride film, for example.

Figure 23:
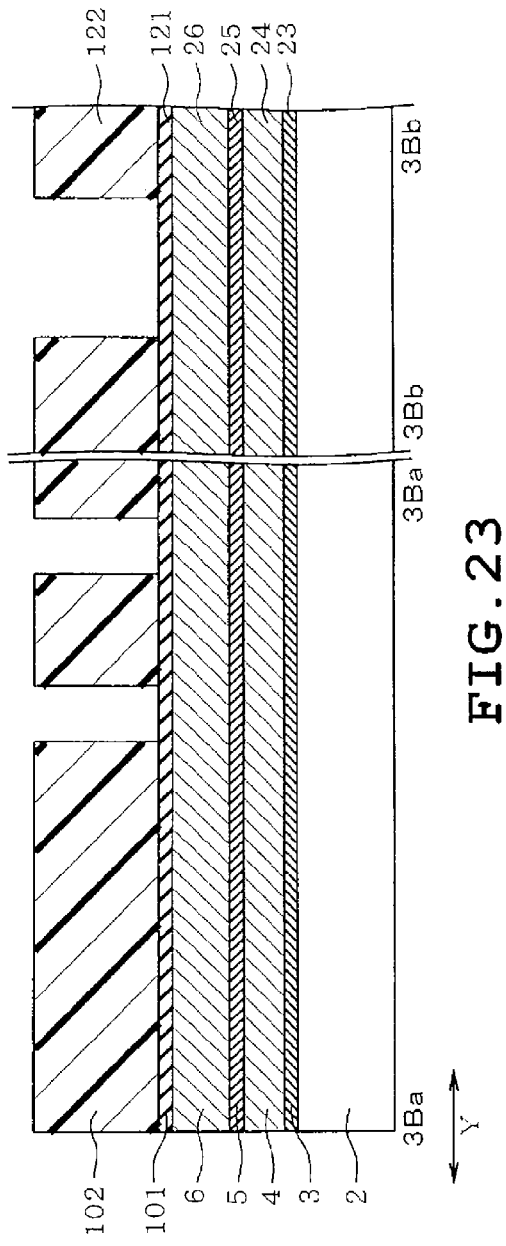

As illustrated in FIG. 23, resist layers 102 and 122 are coated on the upper surfaces of the etch stop films 101 and 121, and resist layers 102 and 122 are patterned using a photolithography method.

Figure 24:
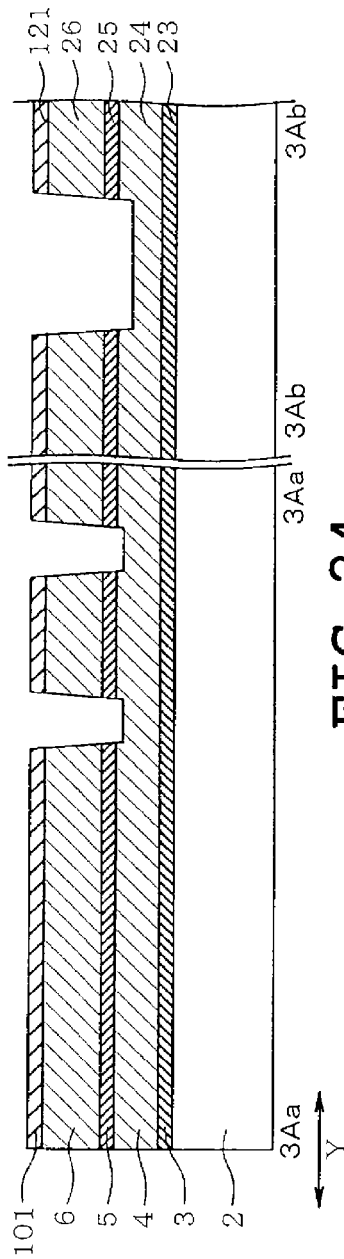
Figure 25:
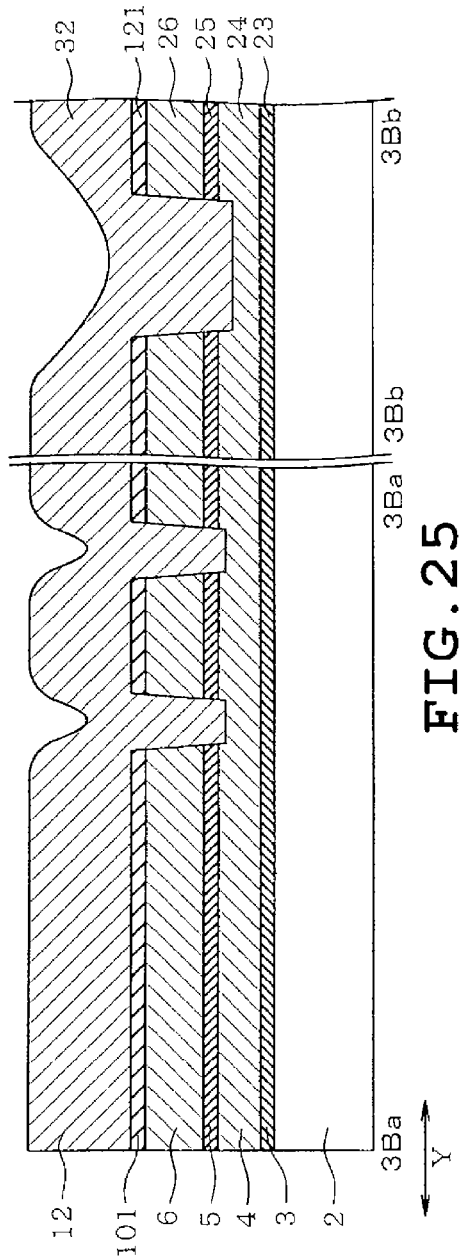

As illustrated in FIG. 24, the etch stop films 101 and 121 are subjected to an anisotropic etching process by the RIE method using the patterned resists 102 and 122 as a mask. The resists 102 and 122 are then removed by asking, and the anisotropic etching process is performed using the etch stop films 101 and 121 as a mask, and holes penetrating the second electrode films 6 and 26 and the interelectrode insulation films 5 and 25 and reaching or extending into the first electrode films 4, 24 are formed. As illustrated in FIG. 25, the third electrode films 12 and 32 are formed in these openings. The third electrode films 12 and 32 are formed of polysilicon, for example. In addition, the conductivity type of the third electrode films 12 and 32 may be n type or p type as long as it is suitably adjusted.

Figure 26:
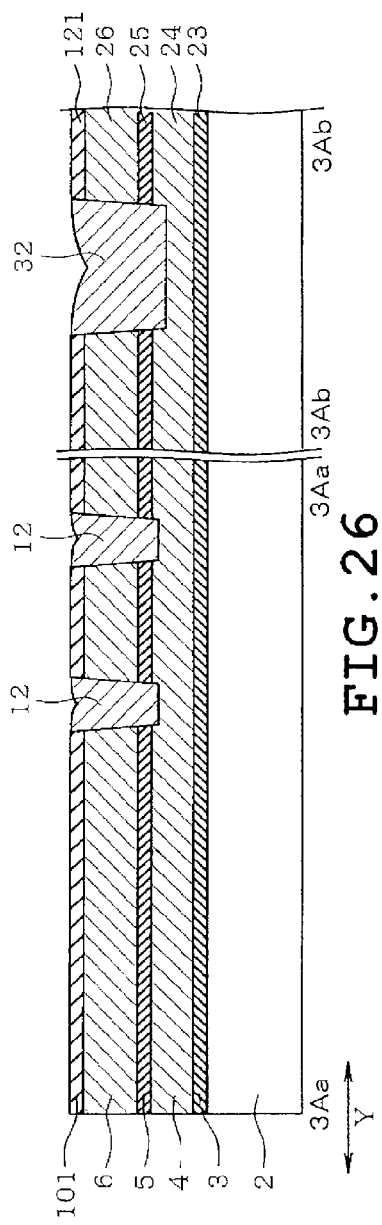

As illustrated in FIG. 26, the third electrode films 12 and 32 overlying the etch stop films 101 and 121 are etched back using the etch stop films 101 and 121 as an etching stop. By doing so, the upper surfaces of the third electrode films 12 and 32 are formed substantially flush with the upper surfaces of the etch stop films 101 and 121.

Figure 27:
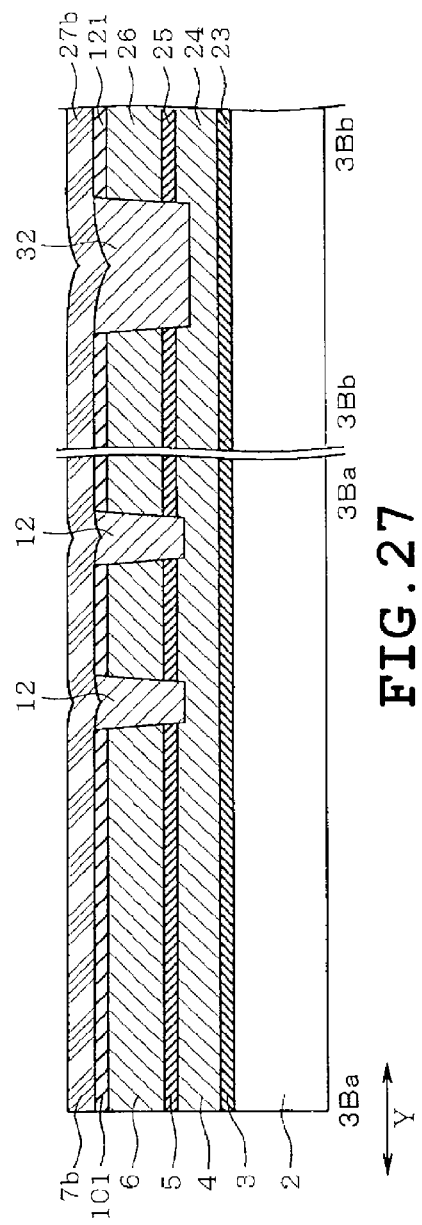
Figure 28:
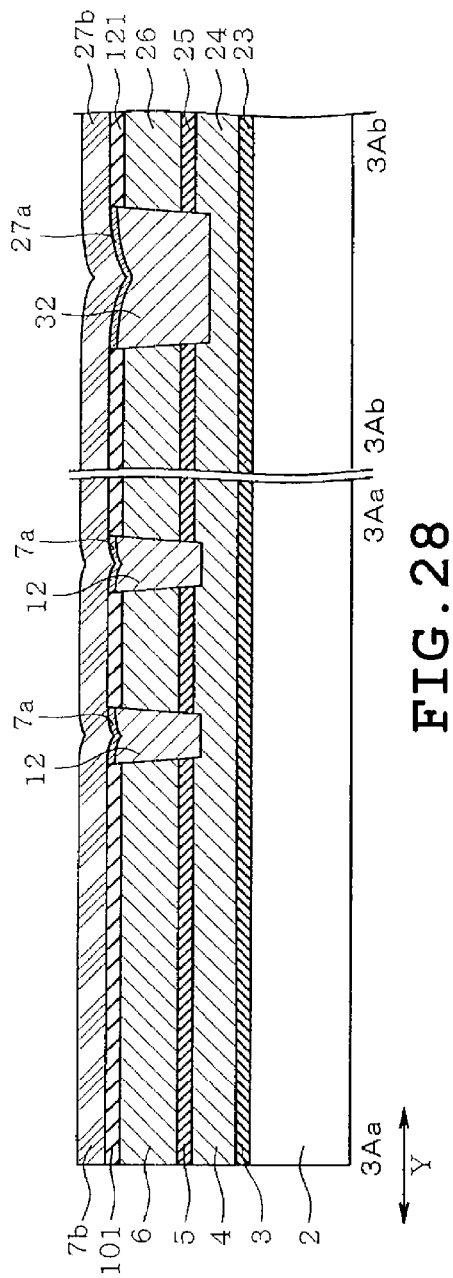
Figure 29:
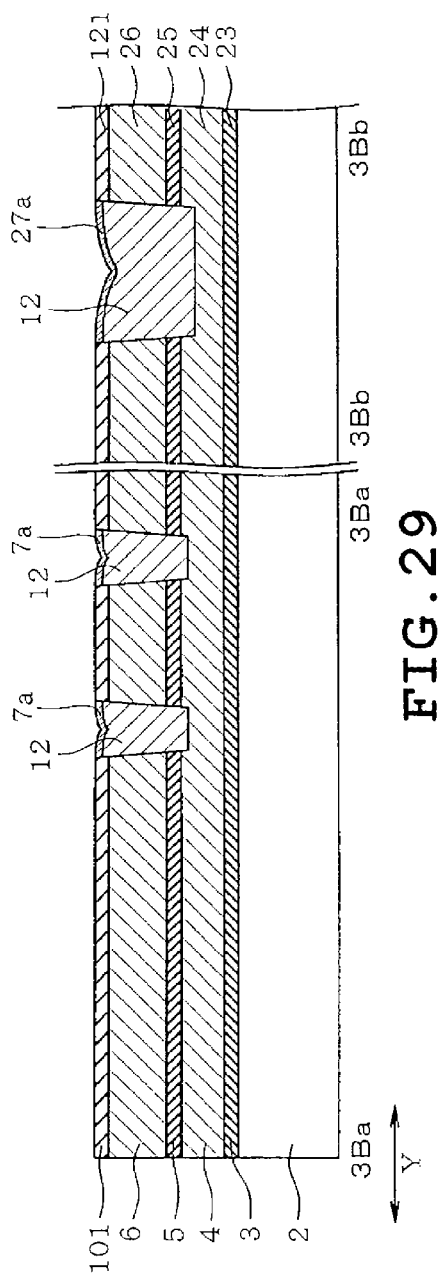

As illustrated in FIG. 27, the metal film layers 7b and 27b of one kind of metal among cobalt (Co), titanium (Ti), tungsten (W), chrome (Cr), and molybdenum (Mo) are formed as films on the upper surfaces of the etch stop films 101 and 121 and the third electrode films 12, 32. As illustrated in FIG. 28, by performing the RTA (rapid thermal annealing) process, the metal silicide layers 7a and 27a are selectively formed only on the upper portion of the third electrode films 12 and 32. As illustrated in FIG. 29, the unreacted metals 7b and 27b are removed using a wet etch chemistry, and the etch stop films 101 and 121 are removed (not shown) using hot phosphoric acid ($H_4PO_4$), for example.

Thereafter, the barrier metal films 7 and 27 are formed on the upper surfaces of the second electrode films 6 and 26 and the upper surfaces of the silicide layers 7a and 27a, and the metal films 8 and 28 are formed on the upper surfaces of the barrier metal films 7 and 27. After that, the gate electrodes MG and PG1 are formed by the RIE method. At that time, it is not necessary to etch the silicide layers 7a and 27a as they are spaced from the locations where the sidewalls of the gates electrodes MG and PG1 are formed. Accordingly, the gate electrodes MG and PG1 are easily processed. Since the steps after that are the same as in the embodiment described above, the description thereof will be omitted.

According to the embodiment, since the silicide layers 7a and 27a are configured on a polymetal gate interface, it is possible to reduce the interface resistance. In addition, the silicide layers 7a and 27a are disposed only on the upper portion of the opening of the gate electrodes MG and PG1 (center of the gate electrodes). As a result, since the silicide layers are not etched during etching of the film layer stacks to form the gates, the gates may be easily processed.

Sixth Embodiment

Figure 30:
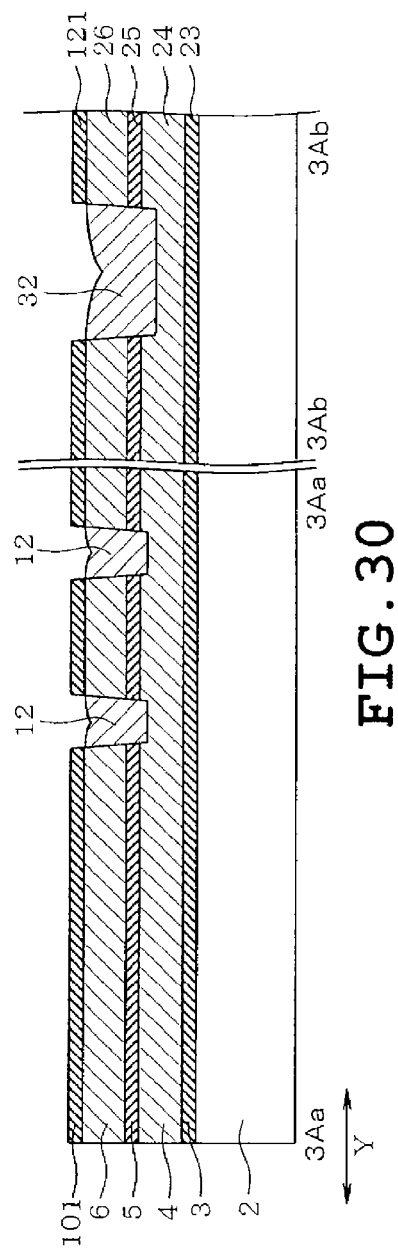
FIG. 30 to FIG. 33 are examples of a longitudinal cross-sectional side view taken along line 3Aa-3Aa of FIG. 2A and line 3Ab-3Ab of FIG. 2B and schematically illustrating one manufacturing stage according to a sixth embodiment.
Figure 31:
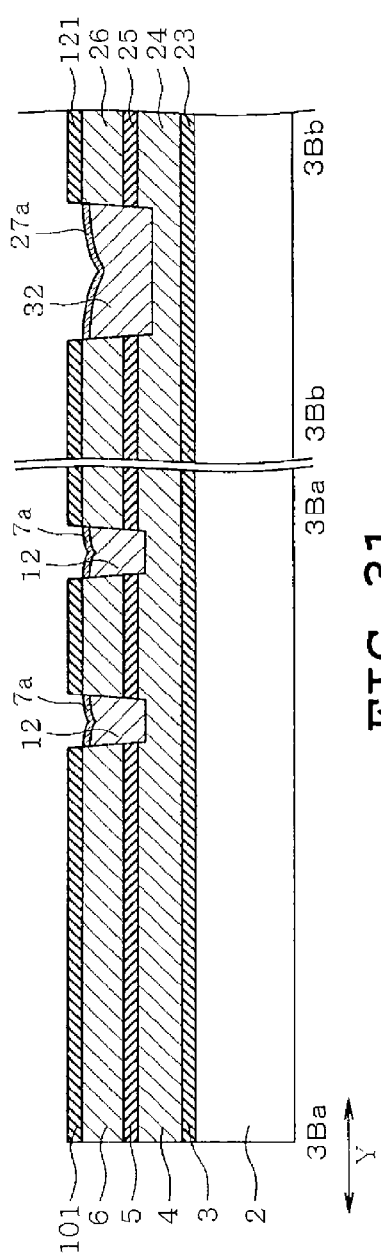
Figure 32:
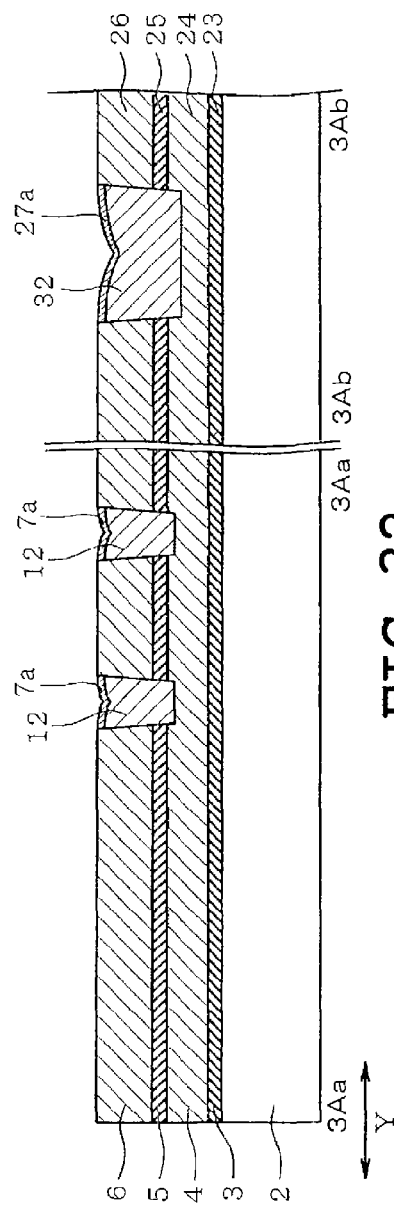
Figure 33:
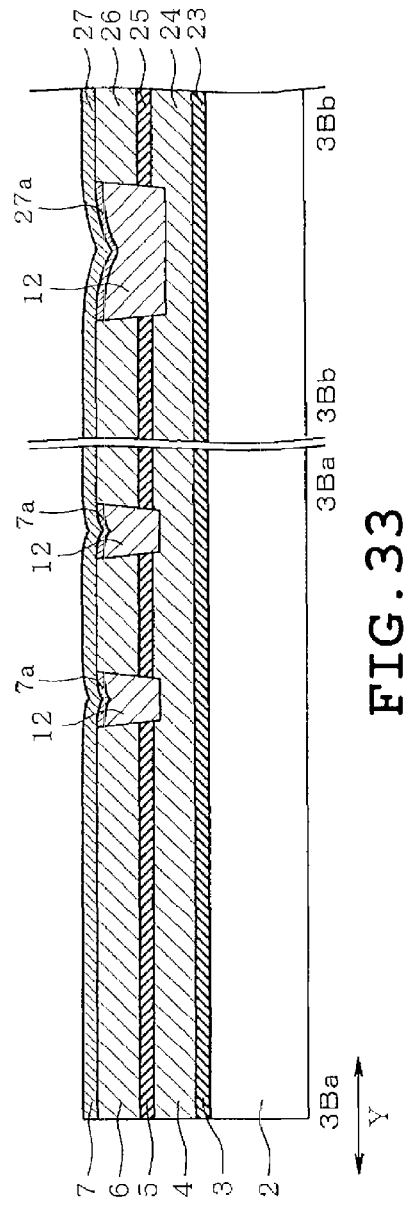
Figure 33B:
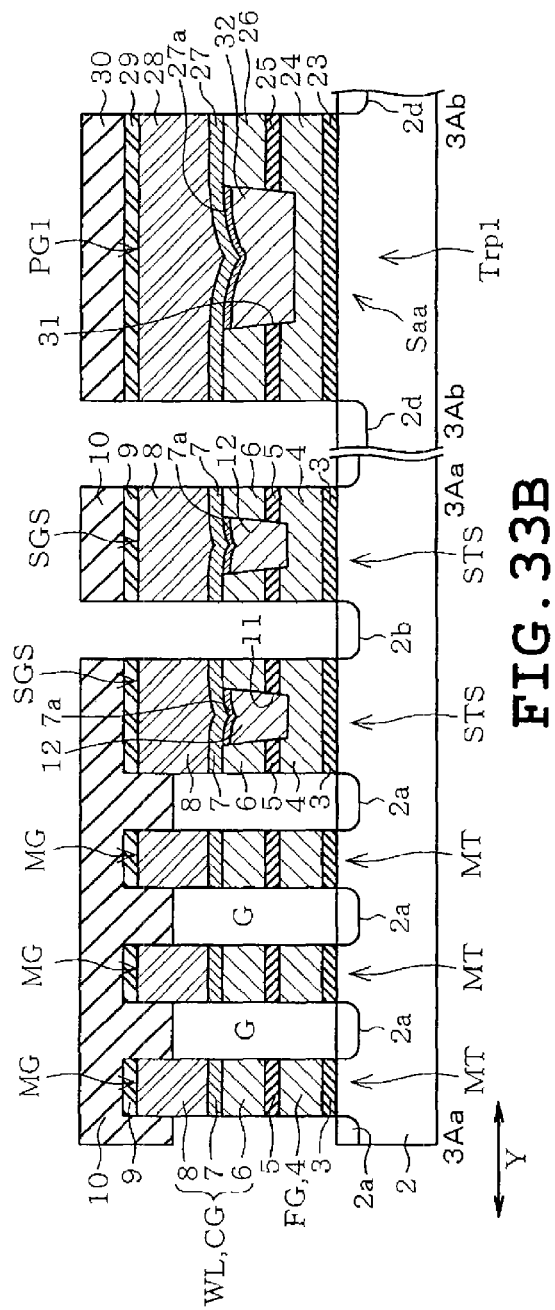
FIG. 33B is an example of a schematic longitudinal cross-sectional side view taken along line 3Aa-3Aa of FIG. 2A and line 3Ab-3Ab of FIG. 2B according to the sixth embodiment.

FIG. 30 to FIG. 33B illustrate a sixth embodiment. As illustrated in FIG. 33B, the upper surfaces of the silicide layers 7a and 27a may be located at the same position of the upper surfaces of the second electrode films 6 and 26. The manufacturing method of the sixth embodiment will be described. FIG. 30 illustrates another state after the etching-back process of the third electrode films 12 and 32 in the fifth embodiment. As illustrated in FIG. 30, after the third electrode films 12 and 32 are subjected to the etching-back process, the upper surfaces of the third electrode films 12 and 32 may not coincide with the upper surfaces of the etch stop films 101 and 121.

The steps after that are illustrated in FIG. 31 to FIG. 33. As illustrated in FIG. 31, the silicide layers 7a and 27a are selectively formed on the upper surfaces of the third electrode films 12 and 32. At that time, the upper surfaces of the silicide layers 7a and 27a are located at the same position as the upper surfaces of the second electrode films 6 and 26. After that, as illustrated in FIG. 32, the stopper films 101 and 121 are removed, and as illustrated in FIG. 33, the barrier metal films 7 and 27 are then formed on the upper surfaces of the second electrode films 6 and 26 and the silicide layers 7a and 27a. After that, the stack of film layers of the upper layers are formed using the manufacturing step illustrated in the embodiment described above, and accordingly the structure illustrated in FIG. 33B may be manufactured.

According to the embodiment, the same effects as in the fifth embodiment may be obtained. In addition, in the stacking direction of the film layers of the gate electrodes MG and PG1, the height of the upper surfaces of the second electrode films 6 and 26 is the same height as the height of the upper surfaces of the silicide layers 7a and 27a. Accordingly, it is possible to reduce the possibility of dividing the barrier metal films 7 and 27 because of a step or discontinuity due to level differences between the upper surfaces of the second electrode films 6 and 26 and the upper surfaces of the third electrode films 12 and 32.

Seventh Embodiment

Figure 34:
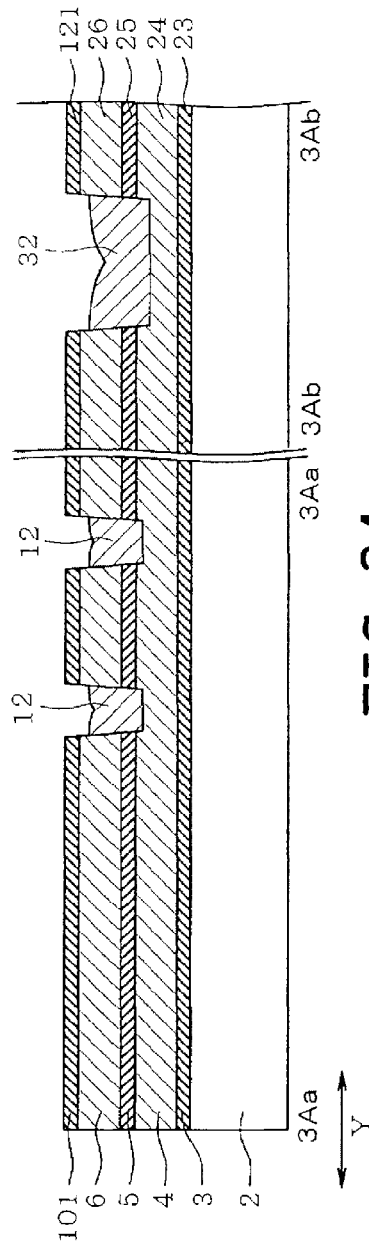
FIG. 34 to FIG. 37 are examples of a longitudinal cross-sectional side view taken along line 3Aa-3Aa of FIG. 2A and line 3Ab-3Ab of FIG. 2B and schematically illustrating one manufacturing stage according to a seventh embodiment.
Figure 35:
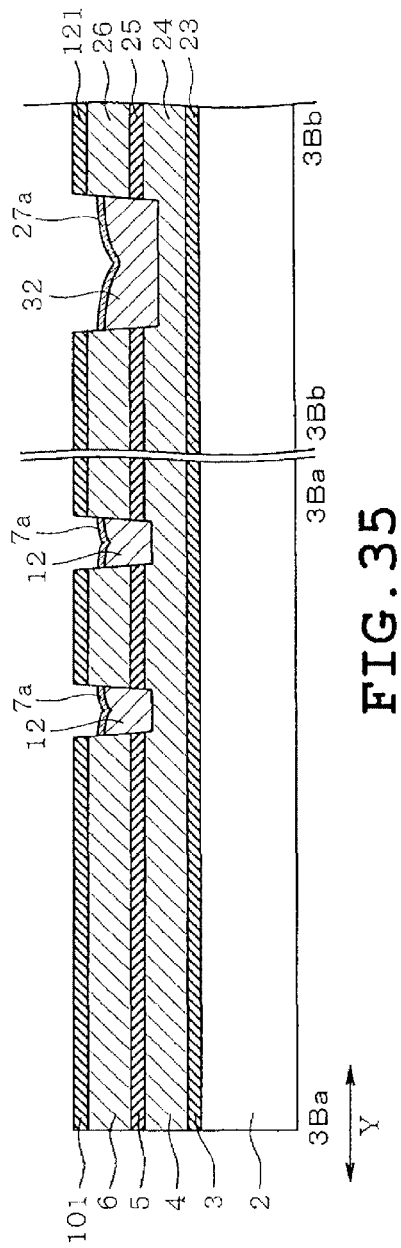
Figure 36:
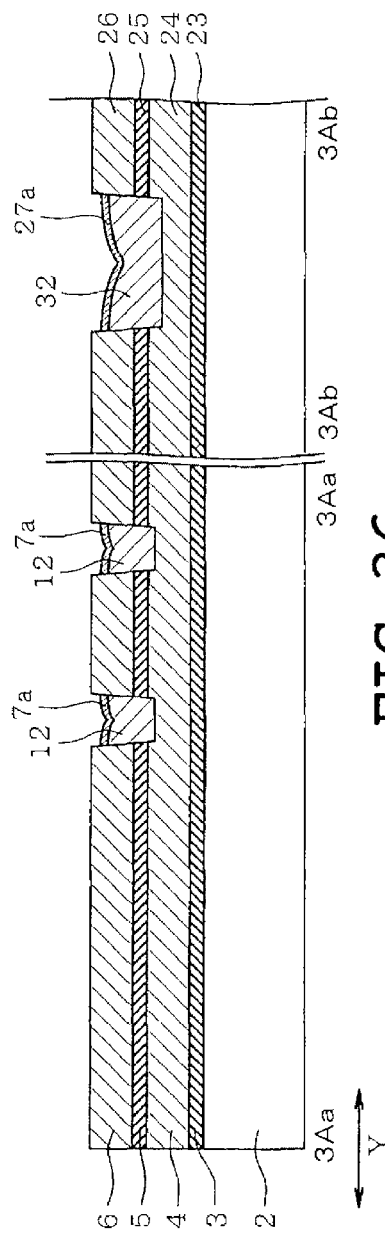
Figure 37:
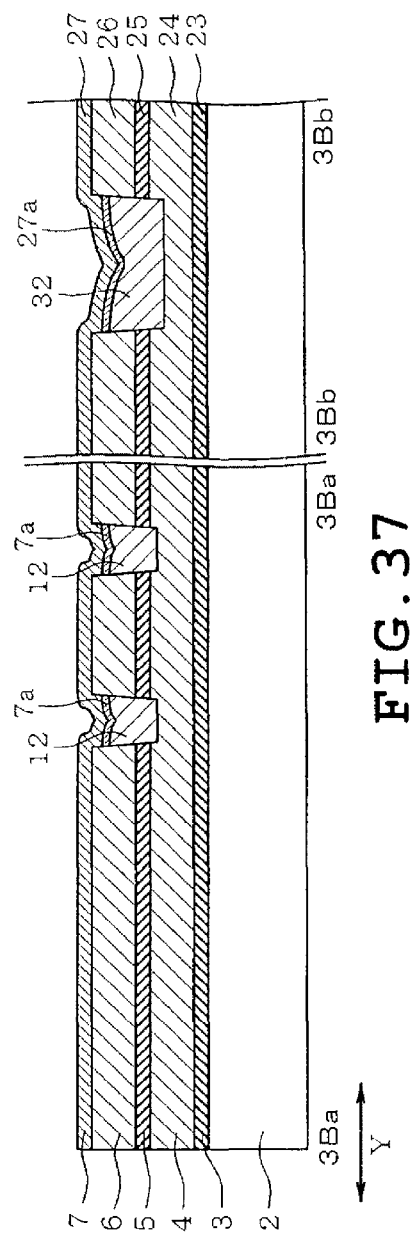
Figure 37B:
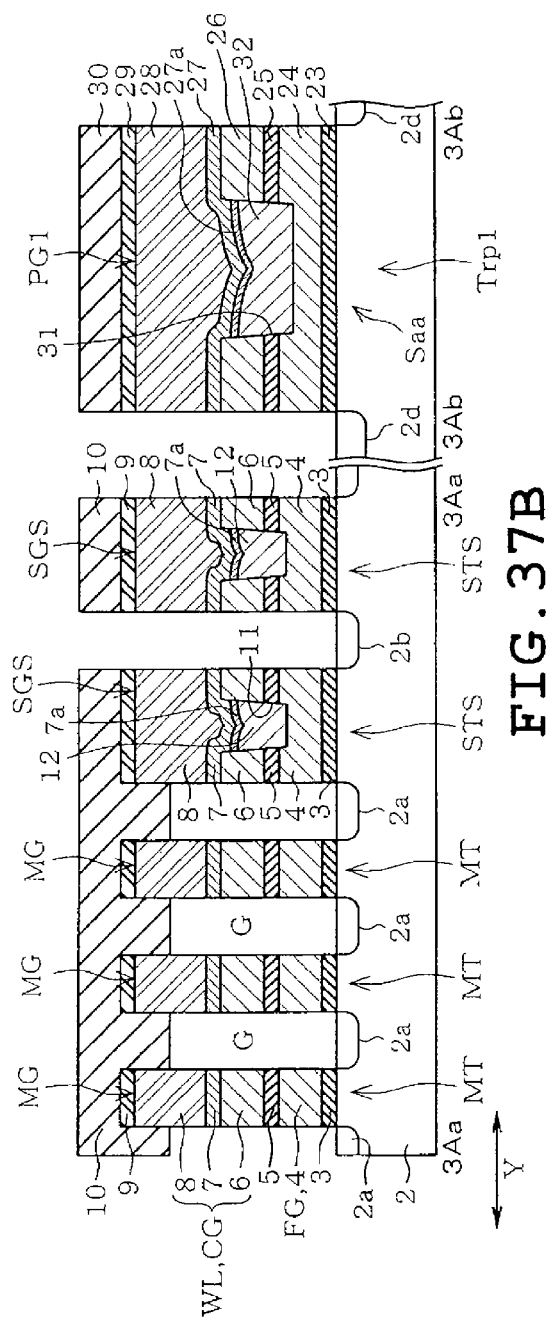
FIG. 37B is an example of a schematic longitudinal cross-sectional side view taken along line 3Aa-3Aa of FIG. 2A and line 3Ab-3Ab of FIG. 2B according to the seventh embodiment.

FIG. 34 to FIG. 37B illustrate a seventh embodiment. As illustrated in FIG. 37B, the upper surfaces of the silicide layers 7a and 27a may be lower than the upper surfaces of the second electrode films 6 and 26, i.e., the silicide layers 7a, 27a are fully inset into the openings in the second electrode films 6, 26. The manufacturing method according to the seventh embodiment will be described. As illustrated in FIG. 34, after performing the etching-back process of the third electrode films 12 and 32, the upper surface of the third electrode films 12 and 32 are lower than the upper surfaces of the etch stop films 101 and 121.

The steps after that are illustrated in FIG. 35 to FIG. 37. As illustrated in FIG. 35, the silicide layers 7a and 27a are selectively formed on the upper surfaces of the third electrode films 12 and 32. At this point, the upper surfaces of the silicide layers 7a and 27a are lower than the upper surface of the second electrode films 6 and 26. After that, as illustrated in FIG. 36, the etch stop films 101 and 121 are removed, and as illustrated in FIG. 33, the barrier metal films 7 and 27 are formed on the upper surfaces of the second electrode films 6 and 26. Thereafter, the upper layers of the gate electrodes are formed using the manufacturing steps illustrated in the embodiment described above, and accordingly the structure illustrated in FIG. 37B may be manufactured.

According to the embodiment, the height of the upper surfaces of the second electrode films 6 and 26 are higher than the height of the upper surfaces of the third electrode films 12 and 32. It is also possible to reduce the interface resistance with such an embodiment.

Eighth Embodiment

Figure 38:
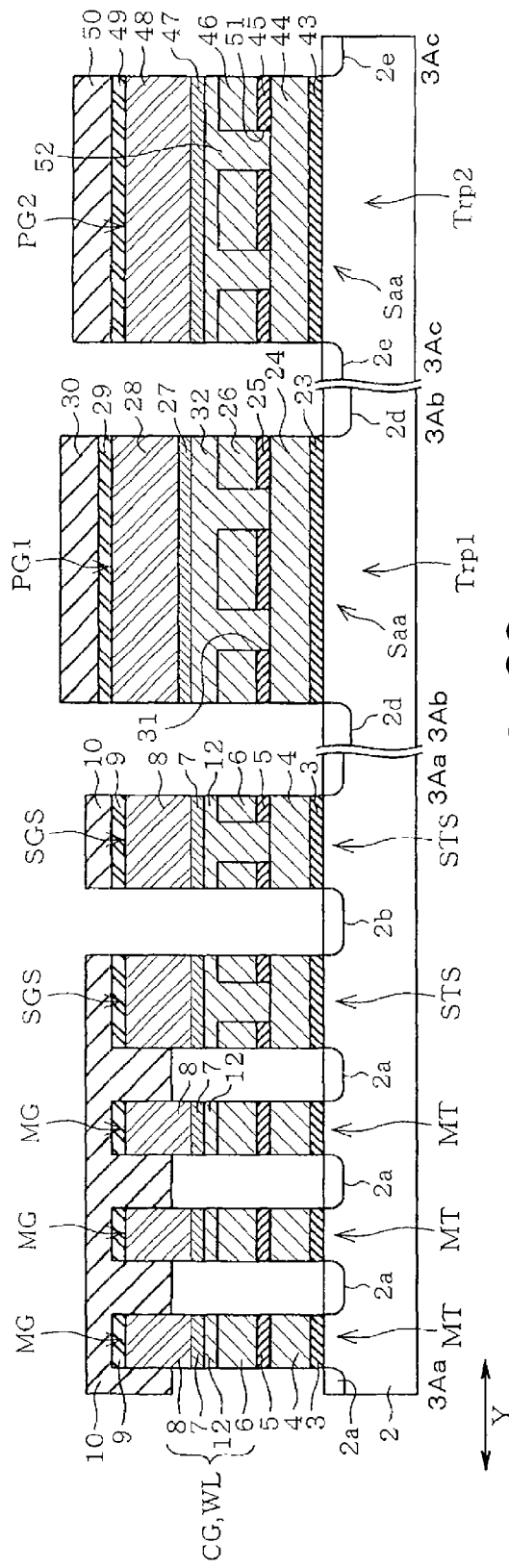
FIG. 38 is an example of a schematic longitudinal cross-sectional side view taken along line 3Aa-3Aa of FIG. 2A, line 3Ab-3Ab of FIG. 2B, and line 3Ac-3Ac of FIG. 2C according to an eighth embodiment.

FIG. 38 illustrates an eighth embodiment. As illustrated in FIG. 38, the film layers of the gate electrode MG of the memory cell MT: The polysilicon film (second electrode film 6), the polysilicon film (third electrode film 12), the barrier metal film 7, and the metal film 8, and the film layers of the gate electrode PG1 of the peripheral circuit: the polysilicon film (second electrode film 26), the polysilicon film (third electrode film 32), the barrier metal film 27, and the metal film 28, may be formed of the same material film layers. In the example illustrated in FIG. 38, the height of the upper surface of the third electrode film 12 is formed to be lower than the height of the upper surface of the third electrode film 32.

That is, in the manufacturing stage illustrated in FIG. 9A and FIG. 9B according to the first embodiment, when performing the etching-back process of the third electrode film 12, the third electrode film 12 remains on the upper surface of the second electrode film 6, while setting the height of the upper surface of the third electrode film 12 to be lower than the height of the upper surface of the third electrode film 32. By doing so, in the final manufacturing stage, it is possible to obtain the structure illustrated in FIG. 38.

In such a structure, since the height of the gate electrode PG1 may be set to be high, it is possible to reduce the resistance of the gate electrode PG1. In addition, since the height of the gate electrode MG of the memory cell MT may be configured to be lower than the height of the gate electrode PG1 of the transistor Trp1, it is possible to reduce the aspect ratio and to improve the integration degree.

Other Embodiments

As the barrier metal film 7, various materials such as tungsten silicide nitride (WSiN), titanium nitride (TiN), ruthenium (Ru), ruthenium oxide (RuO), tantalum (Ta), tantalum nitride (TaN), tantalum silicide nitride (TaSiN), manganese (Mn), manganese oxide (MnO), niobium (Nb), niobium nitride (NbN), molybdenum nitride (MoN), and vanadium (Vn) may be used in addition to, or as alternatives to, the tungsten nitride (WN), as long as it is a material which can suppress the reaction of the metal film and the polycrystalline silicon film.

For the metal film 8, a material such as tungsten silicide (WSi), molybdenum (Mo), and tantalum (Ta) or a material using these materials as a main component may be used, in addition to, or as an alternative to, the tungsten (W).

In addition, regarding the combination of the barrier metal film 7 and the metal film 8, the various combinations may be achieved using various materials described above, in addition to the combination of the tungsten nitride film and the tungsten film.

The material patterns of the electrode structure on the upper surface of the interelectrode insulation films 5, 25, and 45 and on the upper surfaces of the third electrode films 12 and 32 in the openings 11 and 31 may be the same to each other or different from each other, as long as the heights of the electrode structures are formed to be different between the gate electrode MG in the memory cell area M and the gate electrode PG1 in the peripheral circuit area P.

That is, the stacked film layers of the gate electrode MG of the memory cell MT with the polysilicon film (second electrode film 6) and the silicide layer 7a may have the same electrode structure as the stacked film layers of the gate electrode PG1 in the peripheral circuit area P with the polysilicon film (second electrode film 26) and the silicide layer 27a.

The stacked structure of the gate electrode MG of the memory cell MT with the polysilicon film (second electrode film 6), the silicide layer 7a, the barrier metal film 7, and the metal film 8 may also have the same electrode structure as the stacked structure of the gate electrode PG1 in the peripheral circuit with the polysilicon film (second electrode film 26), the silicide layer 27a, the barrier metal film 27, and the metal film 28.

The exemplary embodiment is used in the NAND-type flash memory device 1, but may also be used in a NOR-type flash memory device or a nonvolatile semiconductor memory device such as an EEPROM. In addition, both of the devices configured with the memory cell as 1 bit and the device configured with the memory cell with a plurality of bits may be used.

(Other Configurations)

The superordinate concept, the middle concept, and the subordinate concept of the configurations according to the embodiments and the modification examples described above, or an example of a concept capable of being configured by combining a part of or the entirety of the configurations according to the embodiments and the modification example may be achieved as the following aspect, in addition to the expression in the claims.

[Aspect 1]

A nonvolatile semiconductor memory device including:
a semiconductor substrate;
a memory element that includes a first gate electrode on the semiconductor substrate; and
a peripheral element other than the memory element that includes a second gate electrode on the semiconductor substrate, in which
the first gate electrode of the memory element includes:
a first electrode film that is formed on the semiconductor substrate through a first insulation film,
a second insulation film that is formed on the first electrode film,
a second electrode film that is formed on the second insulation film, and
a first barrier metal film and a first metal film that are formed on the second electrode film,
the second gate electrode of the peripheral element includes:
a third electrode film that is formed on the semiconductor substrate through a third insulation film,
a fourth insulation film that is formed on the third electrode film,
a fourth electrode film that is formed on the fourth insulation film,
a fifth electrode film that is filled in an opening formed to penetrate the fourth electrode film and the fourth insulation film to reach an inside of the third electrode film, and is formed on the fourth electrode film on a side of the opening, and
a second barrier metal film and a second metal film that are formed on the fifth electrode film,
in which a height from an upper surface of the first insulation film to upper surfaces of the first barrier metal film and the first metal film is different from a height from an upper surface of the third insulation film to upper surfaces of the second barrier metal film and the second metal film.

While certain embodiments have been described, these embodiments have been presented by way of example only, and are not intended to limit the scope of the inventions.

Indeed, the novel devices and methods described herein may be embodied in a variety of other forms; furthermore, various omissions, substitutions and changes in the form of the embodiments described herein may be made without departing from the spirit of the inventions.

The accompanying claims and their equivalents are intended to cover such forms or modifications as would fall within the scope and spirit of the inventions.

What is claimed is:

1. A nonvolatile semiconductor memory device comprising:
   a semiconductor substrate;
   a memory element including a first gate electrode having a first thickness disposed on a first insulation film on the semiconductor substrate; and
   a first peripheral element other than a memory element including a second gate electrode having a second thickness disposed on a second insulation film on the semiconductor substrate,
   wherein the first gate electrode and second gate electrode comprise a plurality of film layers, and a configuration of the film layers is different as between the first gate electrode of the memory element and the second gate electrode of the first peripheral element, and
   the first thickness is different from the second thickness, wherein the first gate electrode and second gate electrode comprise a first electrode layer and a second electrode layer, and a third insulating film interposed therebetween, and
   the second gate electrode further includes a third electrode layer overlying the second electrode layer, wherein at least one opening extends through the second electrode layer and the third insulating film, and the third electrode layer extends inwardly of the opening and contacts the first electrode layer, wherein the difference in thickness of the first gate electrode and second gate electrode is equal to the thickness of the third electrode layer overlying the second electrode layer in the second gate electrode.

2. The nonvolatile semiconductor memory device according to claim 1, further comprising:
   a select gate electrode having a third thickness disposed directly adjacent to at least one memory cell, wherein the third thickness is less than the second thickness.

3. The nonvolatile semiconductor memory device according to claim 1, further comprising:
   a second peripheral element other than a memory element having a fourth thickness which is less than the second thickness.

* * * * *